(12) United States Patent
Miyairi et al.

(10) Patent No.: US 9,293,595 B2
(45) Date of Patent: Mar. 22, 2016

(54) SEMICONDUCTOR DEVICE AND MANUFACTURING METHOD THEREOF

(71) Applicant: Semiconductor Energy Laboratory Co., Ltd., Kanagawa-ken (JP)

(72) Inventors: Hidekazu Miyairi, Kanagawa (JP); Takafumi Mizoguchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/607,664

(22) Filed: Jan. 28, 2015

(65) Prior Publication Data

US 2015/0144949 A1   May 28, 2015

Related U.S. Application Data

(62) Division of application No. 13/223,812, filed on Sep. 1, 2011, now Pat. No. 8,946,011.

(30) Foreign Application Priority Data

Sep. 3, 2010  (JP) .................................. 2010-198018
Sep. 10, 2010 (JP) .................................. 2010-202552

(51) Int. Cl.
  *H01L 21/336* (2006.01)
  *H01L 29/786* (2006.01)
  (Continued)

(52) U.S. Cl.
  CPC .... *H01L 29/78669* (2013.01); *H01L 29/41733* (2013.01); *H01L 29/66765* (2013.01);
  (Continued)

(58) Field of Classification Search
  CPC ..................... H01L 27/1214; H01L 29/78696; H01L 29/66765; H01L 27/1225; H01L 29/78678

USPC ......... 257/223, 227, 291, 292, 439, 443, 655, 257/E27.1, E27.125, E27.112, E29.117, 257/E29.145, E29.147, E29.151, E29.182, 257/E29.202, E29.273–E29.299, E29.314, 257/E29.32, E23.016, 59
  See application file for complete search history.

(56) References Cited

U.S. PATENT DOCUMENTS 5,623,157 A   4/1997   Miyazaki et al.
5,804,878 A   9/1998   Miyazaki et al.
(Continued)

FOREIGN PATENT DOCUMENTS

EP   1 394 597 A2   3/2004
JP   04-155315 A    5/1992
(Continued)

OTHER PUBLICATIONS

Taiwanese Office Action re Application No. TW 100131135, dated Aug. 17, 2015.

*Primary Examiner* — David Vu
*Assistant Examiner* — Jonathan Han
(74) *Attorney, Agent, or Firm* — Husch Blackwell LLP

(57) ABSTRACT

A manufacturing method of a semiconductor device having a stacked structure in which a lower layer is exposed is provided without increasing the number of masks. A source electrode layer and a drain electrode layer are formed by forming a conductive film to have a two-layer structure, forming an etching mask thereover, etching the conductive film using the etching mask, and performing side-etching on an upper layer of the conductive film in a state where the etching mask is left so that part of a lower layer is exposed. The thus formed source and drain electrode layers and a pixel electrode layer are connected in a portion of the exposed lower layer. In the conductive film, the lower layer and the upper layer may be a Ti layer and an Al layer, respectively. The plurality of openings may be provided in the etching mask.

6 Claims, 21 Drawing Sheets

(51) Int. Cl.
   *H01L 29/417*   (2006.01)
   *H01L 29/66*    (2006.01)
   *H01L 29/45*    (2006.01)

(52) U.S. Cl.
   CPC .... *H01L29/78609* (2013.01); *H01L 29/78678* (2013.01); *H01L 29/78696* (2013.01); *H01L 29/458* (2013.01)

(56) References Cited

U.S. PATENT DOCUMENTS

| | | |
|---|---|---|
| 6,031,290 A | 2/2000 | Miyazaki et al. |
| 6,100,950 A | 8/2000 | Tanaka |
| 6,166,414 A | 12/2000 | Miyazaki et al. |
| 6,448,612 B1 | 9/2002 | Miyazaki et al. |
| 6,608,353 B2 | 8/2003 | Miyazaki et al. |
| 7,045,399 B2 | 5/2006 | Miyazaki et al. |
| 7,061,016 B2 | 6/2006 | Miyazaki et al. |
| 7,105,898 B2 | 9/2006 | Miyazaki et al. |
| 7,294,855 B2 | 11/2007 | Baek et al. |
| 7,323,713 B2 | 1/2008 | Ishiga et al. |
| 7,470,571 B2 | 12/2008 | Ishiga et al. |
| 7,547,916 B2 | 6/2009 | Miyazaki et al. |
| 7,883,942 B2 | 2/2011 | Baek et al. |
| 7,897,972 B2 | 3/2011 | Miyazaki et al. |
| 7,993,991 B2 | 8/2011 | Miyairi et al. |
| 7,998,801 B2 | 8/2011 | Sasagawa et al. |
| 2009/0146150 A1 | 6/2009 | Hosoya |
| 2010/0148178 A1* | 6/2010 | Godo et al. ............ 257/59 |
| 2010/0271564 A1 | 10/2010 | Nakata |
| 2011/0133201 A1 | 6/2011 | Miyazaki et al. |
| 2011/0147745 A1* | 6/2011 | Sasagawa et al. .......... 257/57 |
| 2011/0147755 A1* | 6/2011 | Miyairi et al. ............ 257/60 |
| 2012/0049190 A1 | 3/2012 | Miyairi |
| 2012/0049283 A1 | 3/2012 | Miyairi et al. |
| 2012/0052661 A1 | 3/2012 | Sasagawa et al. |

FOREIGN PATENT DOCUMENTS

| | | |
|---|---|---|
| JP | 10-115842 A | 5/1998 |
| JP | 10-206892 A | 8/1998 |
| JP | 2004-096115 A | 3/2004 |
| JP | 2006-041161 A | 2/2006 |
| JP | 2009-158941 A | 7/2009 |
| JP | 2009-283919 A | 12/2009 |
| JP | 2010-192877 A | 9/2010 |
| JP | 2010-278320 A | 12/2010 |
| WO | WO 2009/081633 A1 | 7/2009 |

* cited by examiner

SEMICONDUCTOR DEVICE AND MANUFACTURING METHOD THEREOF

This application is a divisional of copending U.S. application Ser. No. 13/223,812, filed on Sep. 1, 2011 which is incorporated herein by reference.

BACKGROUND OF THE INVENTION

1. Field of the Invention

The present invention relates to a semiconductor device and a manufacturing method thereof. Note that in this specification, a semiconductor device refers to a semiconductor element itself or a device including a semiconductor element. As such a semiconductor element, a thin film transistor is given, for example. In addition, a liquid crystal display device and the like are included in the category of a semiconductor device.

2. Description of the Related Art

In recent years, semiconductor devices are indispensable to human life. A semiconductor element such as a thin film transistor included in a semiconductor device is manufactured in such a manner that a thin film is formed over a substrate and the thin film is processed into a desired shape by a photolithography method or the like. Such a manufacturing method is used for forming a liquid crystal display device (for example, a liquid crystal television). It is important for simplification of a process to reduce the number of masks used for a photolithography method. Therefore, many techniques for reducing the number of masks in a manufacturing process have been developed (for example, Patent Document 1).

REFERENCE

Patent Document

[Patent Document 1] Japanese Published Patent Application No. 2009-158941

SUMMARY OF THE INVENTION

FIGS. 21A to 21C each illustrate an example of a conventional inverted staggered thin film transistor that is provided in a liquid crystal display device. The structure of the thin film transistor illustrated in FIG. 21A is as follows: a gate electrode layer 502 is formed over a substrate 500; a gate insulating layer 504 is formed to cover the gate electrode layer 502; a semiconductor layer 506 with a depressed portion is formed over the gate insulating layer 504; an impurity semiconductor layer 508 that does not overlaps with the depressed portion of the semiconductor layer 506 is formed over the semiconductor layer 506; source and drain electrode layers 516 that are each a stack of a conductive layer 510, a conductive layer 512, and a conductive layer 514 are formed over and in contact with at least part of the impurity semiconductor layer 508; a passivation layer 518 is formed to cover the gate insulating layer 504, the semiconductor layer 506, the impurity semiconductor layer 508, and the source and drain electrode layers 516; and a pixel electrode layer 522 is formed over the passivation layer 518. The conductive layer 514 is connected to the pixel electrode layer 522 through an opening 520.

In the structure illustrated in FIG. 21A, however, in the case where the conductive layer 514 is a Ti layer and, for example, an etching step using a $CF_4$ gas that is widely used is employed for a step of forming a depressed portion in the semiconductor layer 506, a by-product is generated from the Ti layer. As a result, a problem arises in that contact resistance between the source and drain electrode layer 516 and the pixel electrode layer 522 is very high in the opening 520.

Accordingly, it is considered that the source and drain electrode layer has a two-layer structure in which an Al layer is formed over a Ti layer.

The structure of the thin film transistor illustrated in FIG. 21B is as follows: a gate electrode layer 602 is formed over a substrate 600; a gate insulating layer 604 is formed to cover the gate electrode layer 602; a semiconductor layer 606 with a depressed portion is formed over the gate insulating layer 604; an impurity semiconductor layer 608 that does not overlaps with the depressed portion of the semiconductor layer 606 is formed over the semiconductor layer 606; source and drain electrode layers 616 that are each a stack of a conductive layer 610 and a conductive layer 612 are formed over and in contact with at least part of the impurity semiconductor layer 608; a passivation layer 618 is formed to cover the gate insulating layer 604, the semiconductor layer 606, the impurity semiconductor layer 608, and the source and drain electrode layers 616; and a pixel electrode layer 622 is formed over the passivation layer 618. The conductive layer 612 is connected to the pixel electrode layer 622 through an opening 620.

In the structure illustrated in FIG. 21B, however, in the case where a layer exposed in the opening 620 is an Al layer and, for example, the pixel electrode layer 622 is formed using an indium tin oxide (ITO), the Al layer and the ITO layer are in contact with each other, so that electrochemical corrosion occurs as generally known. Accordingly, also in this case, contact resistance in the opening is very high.

Therefore, the following may be performed: the Ti layer is not exposed when the depressed portion is formed in the semiconductor layer; the depressed portion is formed in the semiconductor layer; and then the Ti layer is exposed so that the Ti layer and the ITO layer are connected with each other.

The structure of the thin film transistor illustrated in FIG. 21C is as follows: a gate electrode layer 702 is formed over a substrate 700; a gate insulating layer 704 is formed to cover the gate electrode layer 702; a semiconductor layer 706 with a depressed portion is formed over the gate insulating layer 704; an impurity semiconductor layer 708 that does not overlaps with the depressed portion of the semiconductor layer 706 is formed over the semiconductor layer 706; source and drain electrode layers 716 that are each a stack of a conductive layer 710 and a conductive layer 712 are formed over and in contact with at least part of the impurity semiconductor layer 708; a passivation layer 718 is formed to cover the gate insulating layer 704, the semiconductor layer 706, the impurity semiconductor layer 708, and the source and drain electrode layers 716; a pixel electrode layer 722 is formed over the passivation layer 718; and a region where the conductive layer 712 is not formed exists over the conductive layer 710. The conductive layer 710 is connected to the pixel electrode layer 722 through an opening 720.

In the case where the thin film transistor illustrated in FIG. 21C is manufactured, however, the number of masks to be used is increased by one in order to form over the conductive layer 710 a region where the conductive layer 712 is not formed.

In view of the above, an object of one embodiment of the present invention is to provide a manufacturing method of a semiconductor device having a stacked structure in which a lower conductive layer is exposed without increasing the number of masks.

One embodiment of the present invention is a manufacturing method of a semiconductor device, including the steps of: forming a first semiconductor layer, a second semiconductor layer, and an impurity semiconductor layer in this order to form a thin-film stack over a first insulating layer formed to cover a first conductive layer, forming a stacked conductive film to be a second conductive layer and a third conductive layer to cover the thin-film stack, forming an etching mask over the stacked conductive film, performing etching on the stacked conductive film to be the second conductive layer and the third conductive layer using the etching mask to form the second conductive layer, performing side-etching on a portion to be third conductive layer in the etched stacked conductive film so that a part of the second conductive layer is exposed and the third conductive layer is formed, performing etching on the thin-film stack so that at least the first semiconductor layer in a portion that does not overlap with the etching mask is left and exposed, removing the etching mask, forming a second insulating layer over the first insulating layer, the etched thin-film stack, the impurity semiconductor layer, the second conductive layer, and the third conductive layer, forming a contact hole in the second insulating layer so that the contact hole overlaps with the exposed portion of the second conductive layer, and forming a fourth conductive layer over the second insulating layer to be connected to the exposed portion of the second conductive layer through the contact hole.

In the above structure, it is preferable that the first semiconductor layer be a crystalline semiconductor layer, and the second semiconductor layer be a semiconductor layer including an amorphous semiconductor and a minute semiconductor crystal grain.

Note that in the above structure, the first semiconductor layer is not necessarily formed. Accordingly, one embodiment of the present invention is a manufacturing method of a semiconductor device, including the steps of: forming a semiconductor layer and an impurity semiconductor layer in this order to form a thin-film stack over a first insulating layer formed to cover a first conductive layer, forming a stacked conductive film to be a second conductive layer and a third conductive layer to cover the thin-film stack, forming an etching mask over the stacked conductive film, performing etching on the stacked conductive film to be the second conductive layer and the third conductive layer using the etching mask to form the second conductive layer, performing side-etching on a portion to be third conductive layer in the etched stacked conductive film so that a part of the second conductive layer is exposed and the third conductive layer is formed, performing etching on the thin-film stack so that the semiconductor layer in a portion that does not overlap with the etching mask is left and exposed, removing the etching mask, forming a second insulating layer over the first insulating layer, the etched thin-film stack, the second conductive layer, and the third conductive layer, forming a contact hole in the second insulating layer so that the contact hole overlaps with the exposed portion of the second conductive layer, and forming a fourth conductive layer over the second insulating layer to be connected to the exposed portion of the second conductive layer through the contact hole.

Note that the etching mask includes an opening and the number of openings in the etching mask is not limited to one. A plurality of openings which form grating-shape may be provided in the etching mask. Another embodiment of the present invention is a semiconductor device including: a first conductive layer; a first insulating layer covering the first conductive layer; a thin-film stack over the first insulating layer which includes a semiconductor layer and an impurity semiconductor layer; a second conductive layer part of which forms a grating-shaped electrode, which in contact with at least the impurity semiconductor layer of the thin-film stack; a third conductive layer over a part of the second conductive layer; a second insulating layer including a contact hole over the second conductive layer; and a fourth conductive layer connected to the second conductive layer through the contact hole. A distance between a side surface of the third conductive layer and a side surface of the second conductive layer is substantially constant. The contact hole is formed in an intersection portion of the grating-shaped electrode formed using the second conductive layer.

In the above structure, it is preferable that a maximum width of the etching mask around the opening be smaller than twice of a side-etching width in forming the third conductive layer. This is because the third conductive layer is not left in a portion to be the contact hole, whereby a structure in which the third conductive layer and the fourth conductive layer are not in contact with each other can be formed. For example, in the case where the third conductive layer is an aluminum layer and the fourth conductive layer is an ITO layer, this structure can prevent electrochemical corrosion which is caused by contact between these conductive layers. Note that a "side-etching width" means a width of a portion removed from a layer to be etched by etching performed in the direction perpendicular to a side surface of a layer provided over the layer to be etched, in a region where the layer to be etched is left.

In the above structure, a width of each of the plurality of openings formed in the etching mask is preferably the same as a channel length. This is because in general, each of widths of the plurality of openings is preferably small and a channel length of a thin film transistor is the minimum length as long as possible. Further, each of the channel length and widths of the plurality of openings is preferably set to the minimum exposure size of a light-exposure machine.

In the above structure, it is preferable that the second conductive layer be formed using titanium, the third conductive layer be formed using aluminum, the fourth conductive layer be formed using indium tin oxide or indium tin oxide to which indium zinc oxide or silicon oxide is added. This is because of the following: with use of indium tin oxide or indium tin oxide to which indium zinc oxide or silicon oxide is added, the fourth conductive layer can function as a pixel electrode; the second conductive layer formed using titanium can be connected to the fourth conductive layer with low contact resistance and without occurring electrochemical corrosion or the like between the second conductive layer and the fourth conductive layer; and with use of aluminum for the third conductive layer, resistance of a source wiring including the second conductive layer and the third conductive layer can be made low.

Note that in this specification, a pixel transistor is illustrated as a transistor for explaining a semiconductor device; however, the present invention is not limited thereto. The semiconductor device that is one embodiment of the present invention may be a transistor other than the pixel transistor.

Note that in this specification, a "film" refers to a film which is substantially uniformly formed over a surface of an object and supposed to be processed in a later step. On the other hand, a "layer" refers to a layer which is formed by processing a film or a layer which is substantially uniformly formed over a surface of an object and does not need processing in a later step.

According to one embodiment of the present invention, a semiconductor device having a stacked structure in which a lower layer is exposed can be manufactured without increasing the number of masks.

Moreover, according to one embodiment of the present invention, a plurality of openings is devised to be provided per one pixel in the etching mask, so that the contact area in the contact hole can be sufficiently large.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below. Note that in the following description, when considering the size, the size refers to the portion in contact with the lower layer.

Embodiment 1

In this embodiment, a semiconductor device that is one embodiment of the present invention and a manufacturing method thereof are described. Note that in the following description, FIG. 1A, FIG. 2A, FIG. 3A, FIG. 4A, FIG. 5A, FIG. 6A, and FIG. 7A are cross-sectional views taken along line X-Y in FIG. 1B, FIG. 2B, FIG. 3B, FIG. 4B, FIG. 5B, FIG. 6B, and FIG. 7B, respectively.

Figure 1A:
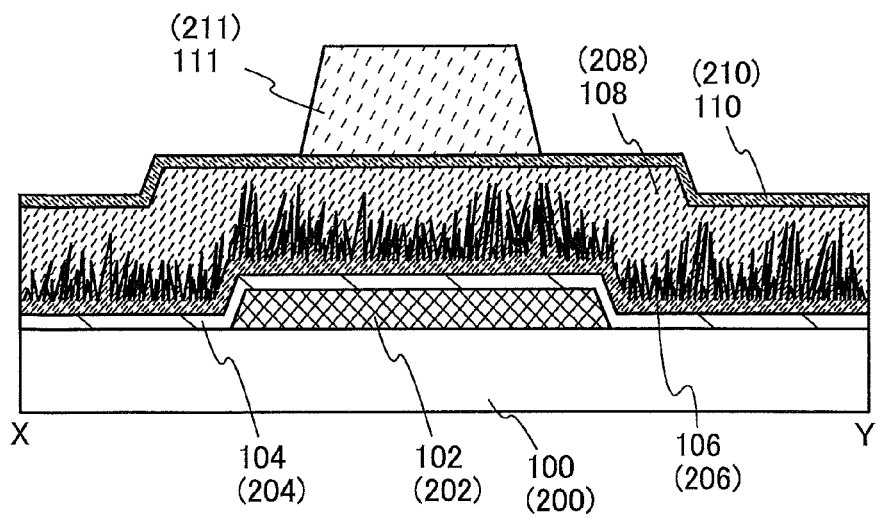
FIGS. 1A and 1B are a cross-sectional view and a top view illustrating a manufacturing method of a semiconductor device that is one embodiment of the present invention.
Figure 1B:
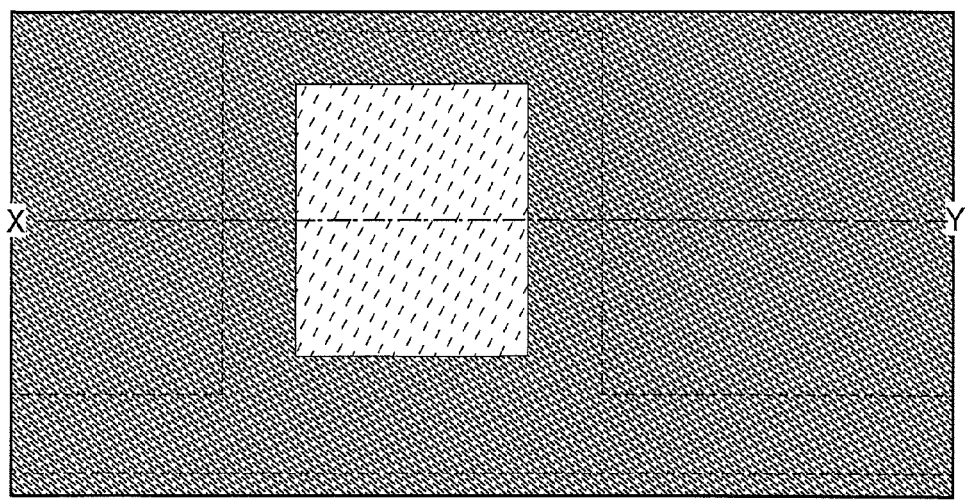

First, a first conductive layer 102 is formed over a substrate 100, and a first insulating layer 104 is formed so as to cover the first conductive layer 102. Next, a first semiconductor film 106, a second semiconductor film 108, and an impurity semiconductor film 110 are stacked in this order over the first insulating layer 104, and an etching mask 111 is formed over the impurity semiconductor film 110 (FIGS. 1A and 1B).

The substrate 100 is an insulating substrate. As the substrate 100, in addition to a glass substrate, a quartz substrate, and a ceramic substrate, a plastic substrate or the like with heat resistance that is high enough to withstand a process temperature in this manufacturing process can be used. In the case where the substrate 100 is a glass substrate, the substrate may have any of the sizes from the first generation (e.g., 320 mm×400 mm) to the tenth generation (e.g., 2950 mm×3400 mm); however, the substrate is not limited thereto.

The first conductive layer 102 may be selectively formed in such a manner that a first conductive film (e.g., a metal film or a semiconductor film to which an impurity element imparting one conductivity type is added; not shown) is formed by a sputtering method, an etching mask is formed over the first conductive film, and etching is performed. Alternatively, an ink-jet method may be used. Note that the first conductive film may have either a single-layer structure or a stacked structure including a plurality of layers. The conductive film may be formed to have a three-layer structure in which an Al layer is sandwiched between Ti layers, for example. Note that the first conductive layer 102 forms at least a scan line and a gate electrode.

The first insulating layer 104 may be formed using an insulating material (e.g., silicon nitride, silicon nitride oxide, silicon oxynitride, or silicon oxide) by a plasma CVD method, for example. Note that the first insulating layer 104 may have either a single-layer structure or a stacked structure including a plurality of layers. Here, the first insulating layer 104 is formed to have a two-layer structure in which a silicon oxynitride layer is stacked over a silicon nitride layer, for example. Note that the first insulating layer 104 forms at least a gate insulating layer.

"Silicon nitride oxide" contains oxygen and nitrogen so that the nitrogen content is higher than the oxygen content, and in the case where measurements are performed using Rutherford backscattering spectrometry (RBS) and hydrogen forward scattering (HFS), preferably contains oxygen, nitrogen, silicon, and hydrogen at 5 at. % to 30 at. %, 20 at. % to 55 at. %, 25 at. % to 35 at. %, and 10 at. % to 30 at. %, respectively.

"Silicon oxynitride" contains oxygen and nitrogen so that the oxygen content is higher than the nitrogen content, and in the case where measurements are performed using RBS and HFS, preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively.

Note that percentages of nitrogen, oxygen, silicon, and hydrogen fall within the ranges given above, where the total number of atoms contained in the silicon oxynitride or the silicon nitride oxide is defined as 100 at. %.

Note that at this point, a surface of the first insulating layer 104 is preferably exposed to plasma generated using an $N_2O$ gas. This is because the surface of the first insulating layer 104 is oxidized by the exposure, whereby the crystallinity of the first semiconductor film 106 formed over the first insulating layer 104 can be improved. The gas used for generating plasma is not limited to an $N_2O$ gas, and a gas that can oxidize the surface of the first insulating layer 104 (an oxidation gas or a gas containing oxygen) can be used.

The first semiconductor film 106 is formed using a semiconductor material having high carrier mobility, and preferably formed using a crystalline semiconductor. As the crystalline semiconductor, a microcrystalline semiconductor is given, for example. Here, a microcrystalline semiconductor is a semiconductor having an intermediate structure between an amorphous structure and a crystalline structure (including a single crystal structure and a polycrystalline structure). A microcrystalline semiconductor is a semiconductor having a third state that is stable in terms of free energy and is a crystalline semiconductor having short-range order and lattice distortion, in which columnar or needle-like crystals having a grain size of 2 nm or more and 200 nm or less, preferably 10 nm or more and 80 nm or less, further preferably 20 nm or more and 50 nm or less have grown in a direction normal to the substrate surface. Thus, there is a case where crystal grain boundaries are formed at the interface of the columnar or needle-like crystal grains. Note that the diameter of the grain here means the maximum diameter of the crystal grain in a plane parallel to the substrate surface. Further, the crystal grain includes an amorphous semiconductor region and a crystallite which is a minute crystal that can be regarded as a single crystal. Note that the crystal grain may include a twin crystal.

As the microcrystalline semiconductor, microcrystalline silicon may be used. Microcrystalline silicon which is one of microcrystalline semiconductors has a peak of Raman spectrum which is shifted to a lower wave number than 520 $cm^{-1}$ that represents single crystal silicon. That is, the peak of the Raman spectrum of the microcrystalline silicon exists between 520 $cm^{-1}$ which represents single crystal silicon and 480 $cm^{-1}$ which represents amorphous silicon. Further, the microcrystalline silicon contains hydrogen or halogen of at least 1 at. % in order to terminate a dangling bond. Furthermore, the microcrystalline silicon contains a rare gas element such as He, Ar, Kr, or Ne to further promote lattice distortion, so that stability is increased and a favorable microcrystalline semiconductor can be obtained.

Moreover, when the concentration of oxygen and nitrogen contained in the crystalline semiconductor film (measured by secondary ion mass spectrometry) is lowered, preferably set to less than $1\times10^{18}$ $cm^{-3}$, the crystallinity of the crystalline semiconductor film can be increased.

Note that the crystalline semiconductor film is preferably formed by two-step deposition treatment. In the two-step deposition treatment, for example, deposition treatment at a first step is performed under low-pressure (500 Pa) and low-dilution conditions, and deposition treatment at a second step is performed under high-pressure (5000 Pa) and high-dilution conditions.

The second semiconductor film 108 may be formed using a semiconductor material having lower carrier mobility than that of the first semiconductor film 106 in order to serve as a buffer layer, and preferably includes an amorphous semiconductor and a minute semiconductor crystal grain. In addition, the second semiconductor film 108 has lower energy at the Urbach edge, which is measured by a constant photocurrent method (CPM) or photoluminescence spectrometry, and a smaller amount of defect absorption spectrum, as compared to a conventional amorphous semiconductor. As compared to the conventional amorphous semiconductor film, such a semiconductor film is a well-ordered semiconductor film which has few defects and a steep tail slope of a level at a band edge (a mobility edge) in the valence band.

The second semiconductor film 108 may include halogen or nitrogen. In the case where the second semiconductor film 108 includes nitrogen, the nitrogen may exist as an NH group or an $NH_2$ group.

Note that here, an interface region between the first semiconductor film 106 and the second semiconductor film 108 includes microcrystalline semiconductor regions and amorphous semiconductor regions between the microcrystalline semiconductor regions. Specifically, the interface region between the first semiconductor film 106 and the second semiconductor film 108 includes a microcrystalline semiconductor region which extends in a conical or pyramidal shape from the first semiconductor film 106 and a region of "a film containing an amorphous semiconductor" which is similar to the second semiconductor film 108.

Since the second semiconductor film 108 serves as a buffer layer, the off-state current of a transistor can be reduced. Further, since the interface region has the conical or pyramidal microcrystalline semiconductor regions, resistance in the vertical direction (the film thickness direction), that is, resistance between the second semiconductor film 108 and a source region or a drain region formed of the impurity semiconductor film 110, can be lowered. Thus, the on-state current of the transistor can be increased. That is to say, as compared to the case of using the conventional amorphous semiconductor, the off-state current can be sufficiently reduced and reduction in on-state current can be suppressed; thus, switching characteristics of the transistor can be improved.

Note that when a first semiconductor layer formed from the first semiconductor film 106 is thinned in the completed transistor, the on-state current is decreased. Therefore, to increase the on/off ratio, the first semiconductor film 106 may be formed thick.

A large portion of the above microcrystalline semiconductor region preferably includes crystal grains having a conical or pyramidal shape whose top gets narrower from the first semiconductor film 106 toward the second semiconductor film 108. Alternatively, a large portion of the above microcrystalline semiconductor region may include crystal grains having a conical or pyramidal shape whose top gets wider from the first semiconductor film 106 toward the second semiconductor film 108.

In the above interface region, when the microcrystalline semiconductor region includes crystal grains having a conical or pyramidal shape whose top gets narrower from the first semiconductor film 106 toward the second semiconductor film 108, the proportion of the microcrystalline semiconductor region on the first semiconductor film 106 side is higher than that on the second semiconductor film 108 side. The microcrystalline semiconductor region grows from a surface of the first semiconductor film 106 in the film thickness direction. When the flow rate of hydrogen with respect to that of a deposition gas (e.g., silane) in a source gas is low (that is, the dilution ratio is low) or when the concentration of a source gas containing nitrogen is high, crystal growth of the microcrystalline semiconductor region is suppressed, and thus, crystal grains come to have a conical or pyramidal shape, and a large portion of the deposited semiconductor is amorphous.

The above interface region preferably contains nitrogen, in particular, an NH group or an $NH_2$ group. This is because defects are reduced and carriers flow easily when nitrogen, in particular, an NH group or an $NH_2$ group is bonded with dangling bonds of silicon atoms at an interface between crystal grains included in the microcrystalline semiconductor region or at an interface between the microcrystalline semiconductor region and the amorphous semiconductor region. Accordingly, by setting the concentration of nitrogen, preferably, an NH group or an $NH_2$ group to $1\times10^{20}$ $cm^{-3}$ to $1\times10^{21}$ $cm^{-3}$, the dangling bonds of silicon atoms can be easily cross-linked with nitrogen, preferably an NH group or an $NH_2$ group, so that carriers can flow easily. As a result, a bond which promotes the carrier transfer is formed at a crystal grain boundary or a defect, whereby the carrier mobility of the interface region is increased. Therefore, the field effect mobility of the transistor is improved.

Further, when the concentration of oxygen in the interface region is reduced, defect density at the interface between the microcrystalline semiconductor region and the amorphous semiconductor region or the interface between crystal grains can be reduced, so that bonds which inhibit carrier transfer can be reduced.

The impurity semiconductor film 110 is formed using a semiconductor to which an impurity element imparting one conductivity type is added. When the transistor is an n-channel transistor, silicon to which phosphorus (P) or arsenic (As) is added is given as a semiconductor to which the impurity element imparting one conductivity type is added, for example. Meanwhile, when the transistor is a p-channel transistor, for example, boron (B) may be added as the impurity element imparting one conductivity type. Note that it is preferable that the transistor be an n-channel transistor. Therefore, for example, silicon to which P is added is used here. The impurity semiconductor film 110 may be formed using an amorphous semiconductor or a crystalline semiconductor such as a microcrystalline semiconductor.

Note that it is preferable that the first insulating layer 104, the first semiconductor film 106, the second semiconductor film 108, and the impurity semiconductor film 110 be formed successively in one chamber. This is because an interface between the first insulating layer 104 and the first semiconductor film 106, an interface between the first semiconductor film 106 and the second semiconductor film 108, and an interface between the second semiconductor film 108 and the impurity semiconductor film 110 are prevented from containing an impurity.

The etching mask 111 may be formed using a resist material.

Figure 2A:
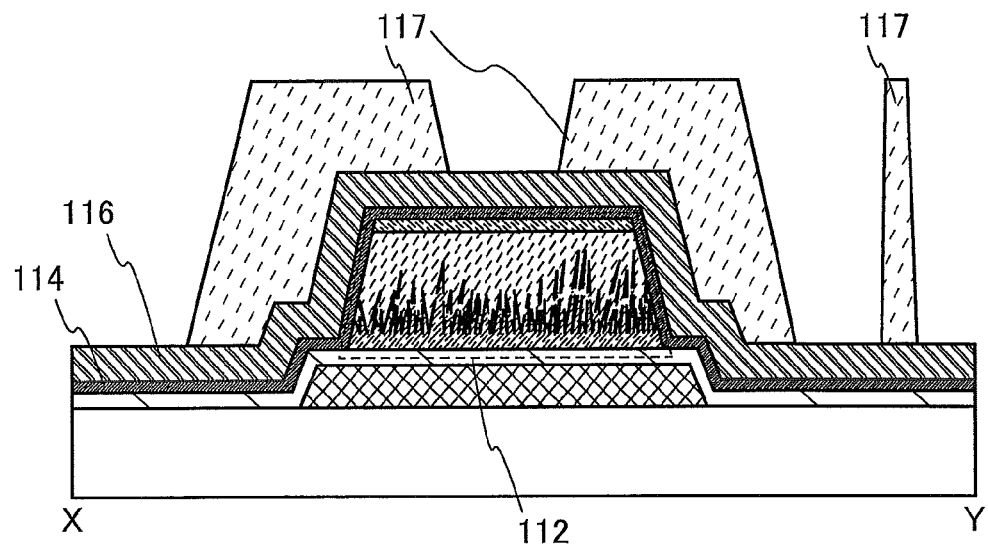
FIGS. 2A and 2B are a cross-sectional view and a top view illustrating the manufacturing method of a semiconductor device that is one embodiment of the present invention.
Figure 2B:
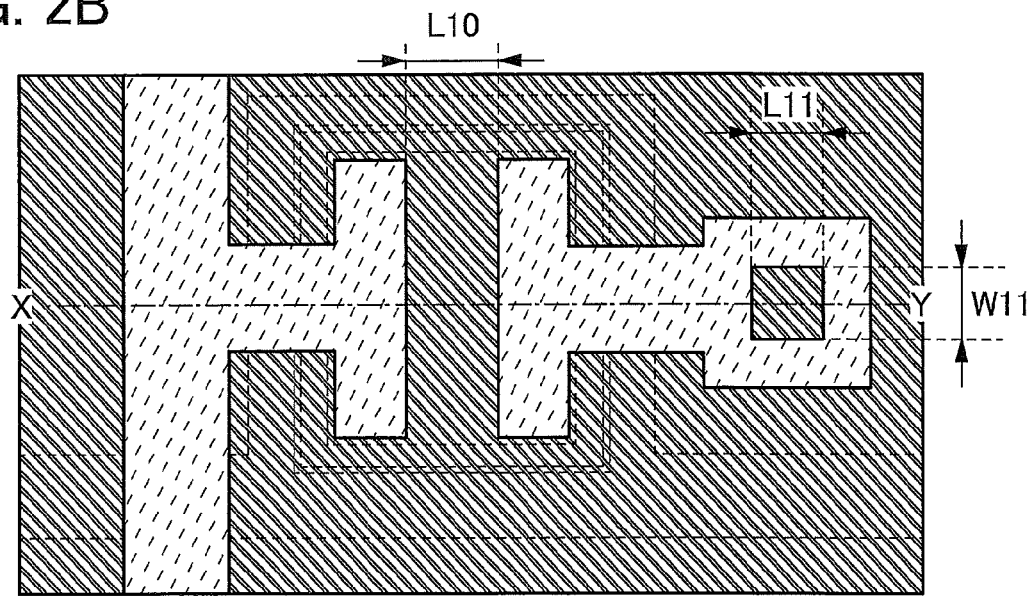

Next, the first semiconductor film 106, the second semiconductor film 108, and the impurity semiconductor film 110 are etched using the etching mask 111, whereby a thin-film stack 112 is formed. Then, a second conductive film 114 and a third conductive film 116 are formed over the first insulating layer 104 and the thin-film stack 112, and an etching mask 117 is formed over the third conductive film 116 (FIGS. 2A and 2B).

Note that in the case where the thin-film stack 112 includes the first semiconductor layer that is obtained by processing the first semiconductor film 106, it is preferable to perform insulation treatment on the side surfaces of the thin-film stack 112. That is because the off-state current increases in many cases when the first semiconductor layer and the conductive layer serving as a source and drain of the completed transistor are in contact with each other. Here, for the insulation treatment, the side surfaces of the thin-film stack 112 may be exposed to oxygen plasma or nitrogen plasma. Alternatively, the insulation treatment may be performed as follows: an insulating film is formed while the side surfaces of the thin-film stack 112 are exposed, and the insulating film is etched in the direction perpendicular to a surface of the substrate 100 by an etching method with high anisotropy, so that side wall insulating layers are formed in contact with the side surfaces of the thin-film stack 112.

The second conductive film 114 may be formed using titanium, and the third conductive film 116 may be formed using aluminum. Note that the materials are not limited thereto. Any material can be used for the second conductive film 114 as long as it can be connected favorably to a fourth conductive layer formed later. Any material can be used for the third conductive film 116 as long as it is a low-resistance material that can reduce wiring resistance.

The etching mask 117 may be formed using a resist material.

Note that the etching mask 117 is preferably formed so that the width of an opening illustrated in FIGS. 2A and 2B is a minimum width. This is because, when L11 and W11 are large, an area of a light-transmitting region becomes small, which is one of causes of decrease in aperture ratio in the case of application to a light-transmitting display device. Note that although L11=W11 in FIG. 2B, there in no particular limitation. However, the etching mask is preferably formed so that both L11 and W11 in FIG. 2B have the minimum value; therefore, L11=W11 is preferable.

Note that when a layout of a thin film transistor is designed, the channel length L10 is preferably made small. In general, the channel length L10 is the minimum size which can be formed using the etching mask 117. Therefore, L10 is preferably set to the minimum exposure size of a light-exposure machine.

Here, since L11 and W11 are preferably small, it is preferable that L10=L11=W11. Further, the sizes thereof are preferably set to the minimum exposure size of a light-exposure machine.

Figure 3A:
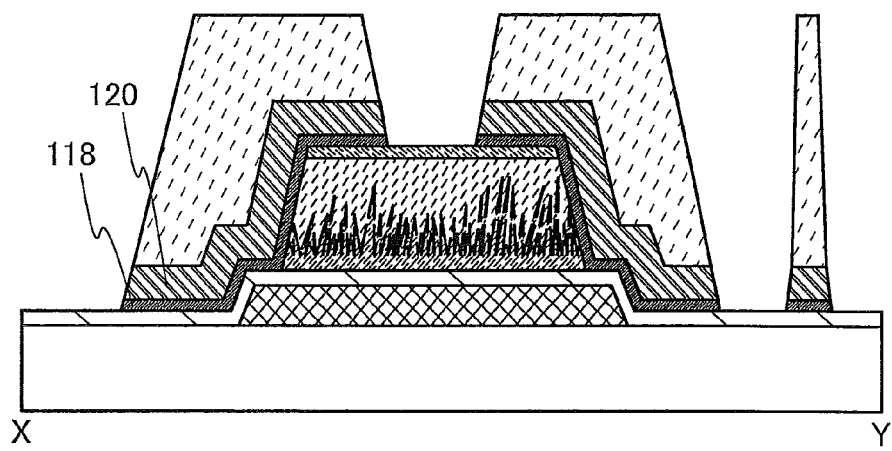
FIGS. 3A and 3B are a cross-sectional view and a top view illustrating the manufacturing method of a semiconductor device that is one embodiment of the present invention.
Figure 3B:
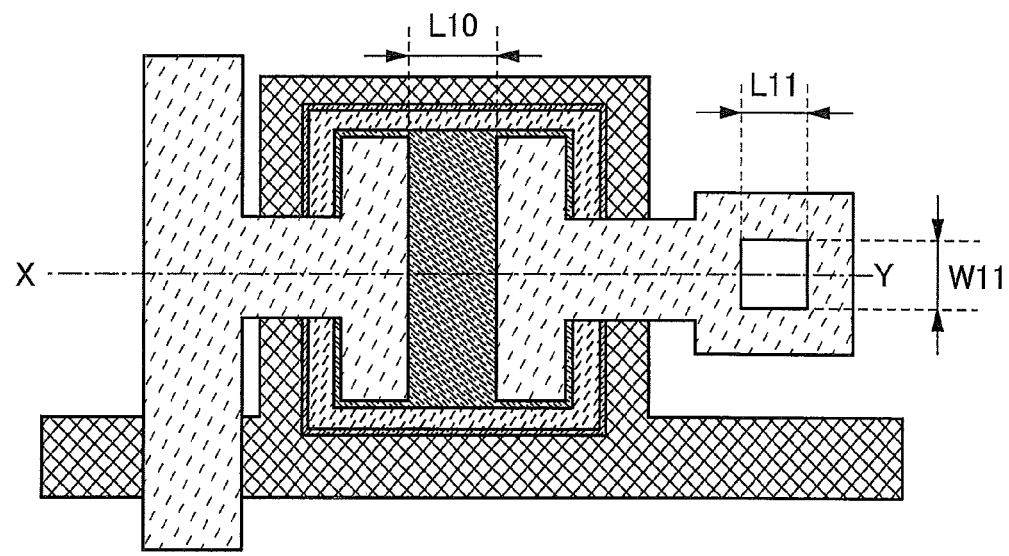

Then, the second conductive film 114 and the third conductive film 116 are etched using the etching mask 117, so that a second conductive layer 118 and an etched third conductive film 120 are formed (FIGS. 3A and 3B).

Note that a step of etching the third conductive film 116 and a step of etching the second conductive film 114 may be performed collectively by one etching step, or may be performed by a plurality of etching steps. It is preferable to perform collectively by one etching step in terms of simplification of the manufacturing process. In the case where the third conductive film 116 and the second conductive film 114 are etched collectively by one etching step, a gas containing chlorine may be used, for example.

Note that when the second conductive layer 118 and the etched third conductive film 120 are formed by etching the second conductive film 114 and the third conductive film 116, an upper portion of the thin-film stack 112 is also etched in many cases.

Figure 4A:
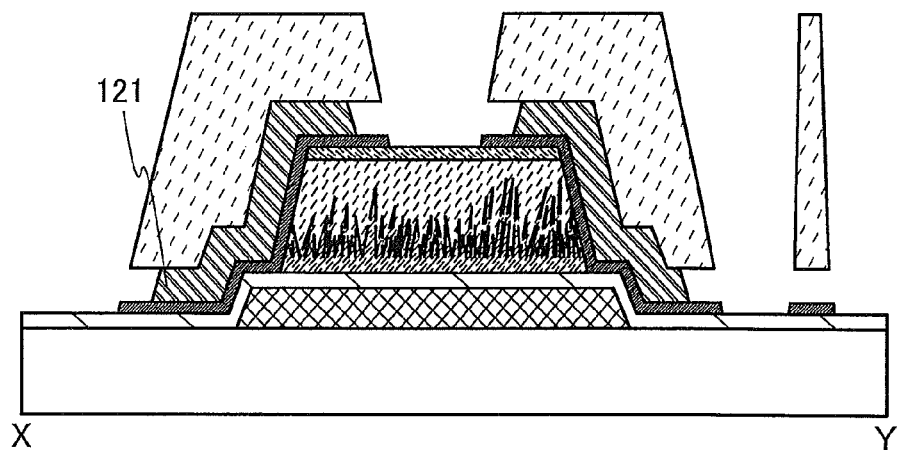
FIGS. 4A and 4B are a cross-sectional view and a top view illustrating the manufacturing method of a semiconductor device that is one embodiment of the present invention.
Figure 4B:
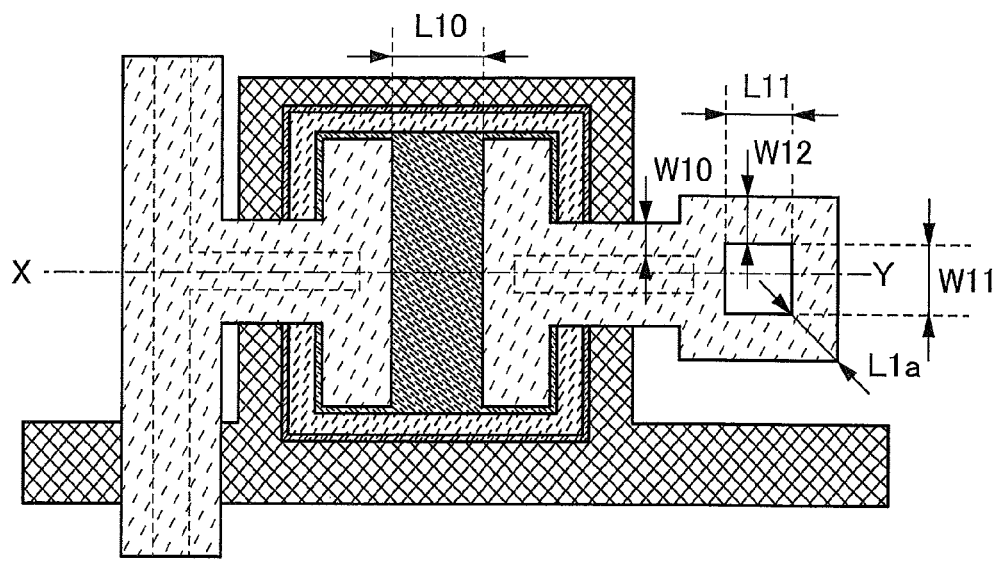

Next, the etched third conductive film 120 is etched, so that a third conductive layer 121 is formed (FIGS. 4A and 4B).

Here, the etched third conductive film 120 may be subjected to side-etching. As an etchant for side-etching of the etched third conductive film 120, a chemical solution in which phosphoric acid, acetic acid, nitric acid, and pure water are mixed at the volume ratio of 85:5:5:5 is preferably used. Note that the etchant is not limited thereto, and aqua regia, nitric acid at a high temperature (50° C. to 100° C., preferably 60° C. to 75° C.), perchloric acid at a high temperature (50° C. to 100° C., preferably 60° C. to 75° C.), or the like can be used as the etchant.

The top surface shape of the etching mask 117 is determined depending on the width (the side-etching width) of a portion removed from etched third conductive film 120 by side-etching.

In FIG. 4B, a distance W10 between an edge of the etching mask 117 and an edge of the third conductive layer 121 is substantially equal to the side-etching width of the etched third conductive film 120.

Note that in FIG. 4B, a minimum width W12 of a portion adjacent to the opening provided in the etching mask 117 is smaller than twice of the side-etching width of the etched third conductive film 120. In that case, the third conductive layer 121 does not exist in the portion.

Further, in FIG. 4B, a maximum width L1a of a portion adjacent to the opening provided in the etching mask 117 is smaller than twice of the side-etching width of the etched third conductive film 120. In that case, the third conductive layer 121 does not exist in the portion.

Note that here, $L1a=\sqrt{2}\cdot W12$ is satisfied; and $2W10>L1a$ is satisfied; thus, the relation between W10 and W12 may satisfy at least the formula $W12<\sqrt{2}\cdot W10$.

Figure 5A:
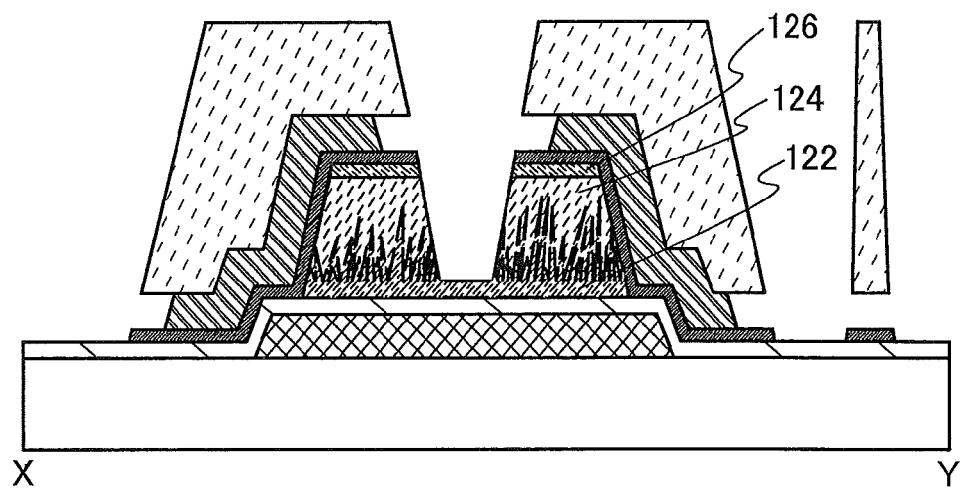
FIGS. 5A and 5B are a cross-sectional view and a top view illustrating the manufacturing method of a semiconductor device that is one embodiment of the present invention.
Figure 5B:
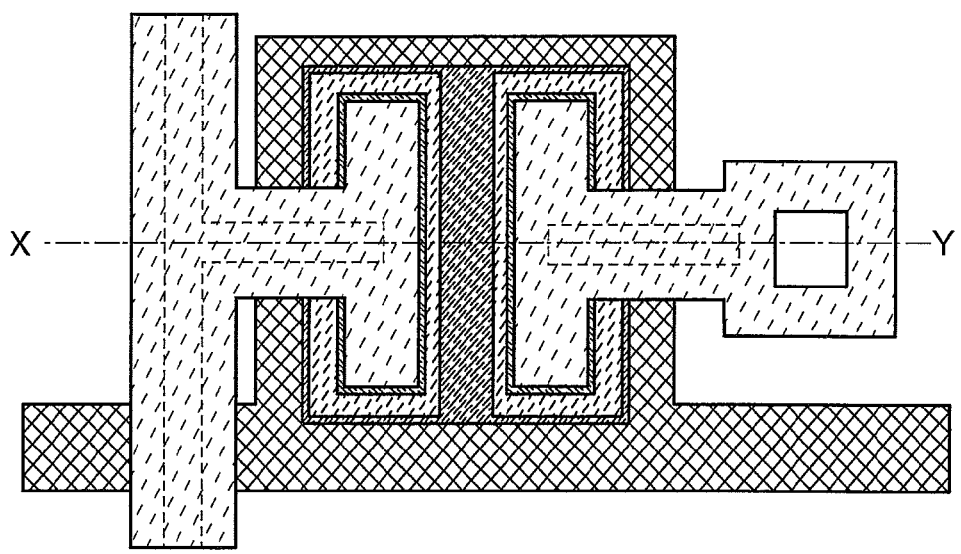

Next, the upper portion of the thin-film stack 112 is etched, so that a first semiconductor layer 122, a second semiconductor layer 124, and an impurity semiconductor layer 126 are formed (FIGS. 5A and 5B). At this time, the thin-film stack 112 may be etched by one step or a plurality of steps. It is preferable that the etching be performed so that a portion of the first semiconductor layer 122 that does not overlap with the second semiconductor layer 124 (i.e., a portion to be a channel formation region) is finally formed.

Here, since the etching of the thin-film stack 112 is performed so that the portion of the first semiconductor layer 122 that does not overlap with the second semiconductor layer 124 (i.e., the portion to be a channel formation region) is formed, it is preferable to employ an etching method in which the etching selectivity of the amorphous semiconductor film with respect to the crystalline semiconductor film is high. As such an etching method, etching using a mixed gas of a Br-based gas, an F-based gas, and an oxygen gas is given, for example. Here, an HBr gas may be used as the Br-based gas; and an $SF_6$ gas, a $CF_4$ gas, or an $NF_3$ gas may be used as the F-based gas. In the case where an HBr gas and an $SF_6$ gas are used, a preferable flow rate is that an HBr gas: an $SF_6$ gas: an oxygen gas=25:2:1.

Figure 6A:
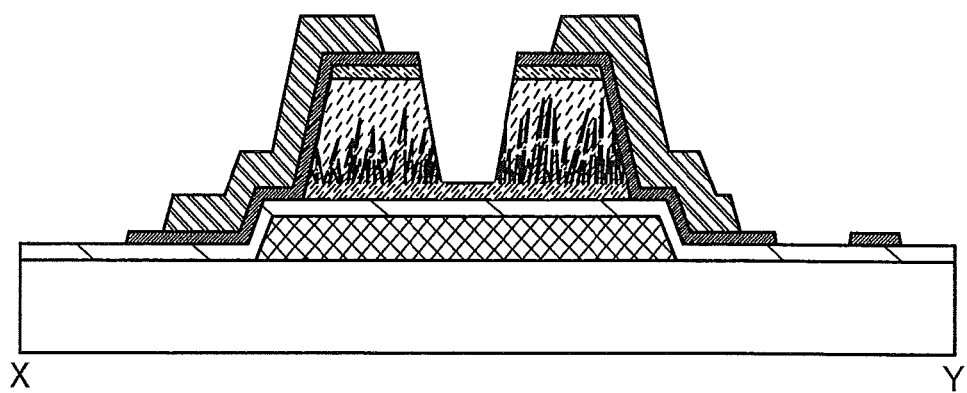
FIGS. 6A and 6B are a cross-sectional view and a top view illustrating the manufacturing method of a semiconductor device that is one embodiment of the present invention.
Figure 6B:
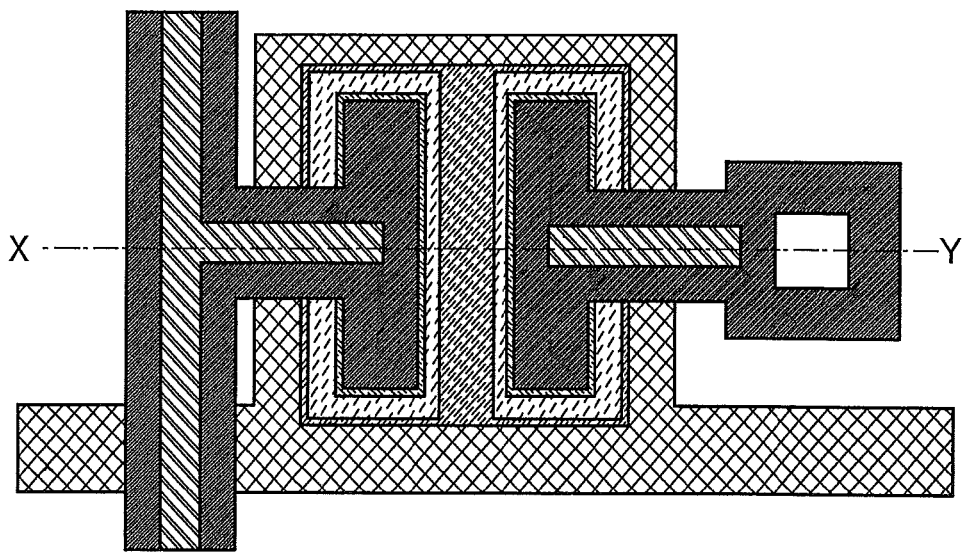

After that, the etching mask 117 is removed (FIGS. 6A and 6B).

Figure 7A:
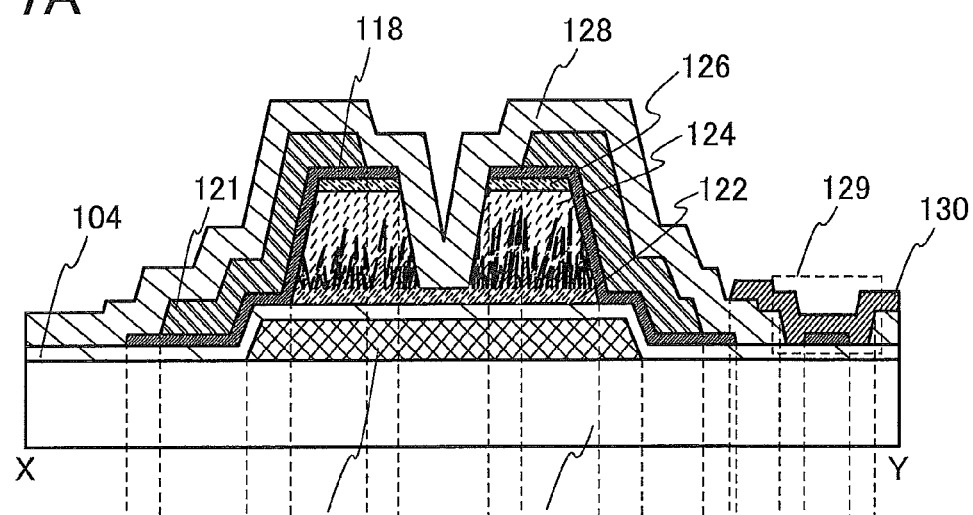
FIGS. 7A and 7B are a cross-sectional view and a top view illustrating the manufacturing method of a semiconductor device that is one embodiment of the present invention.
Figure 7B:
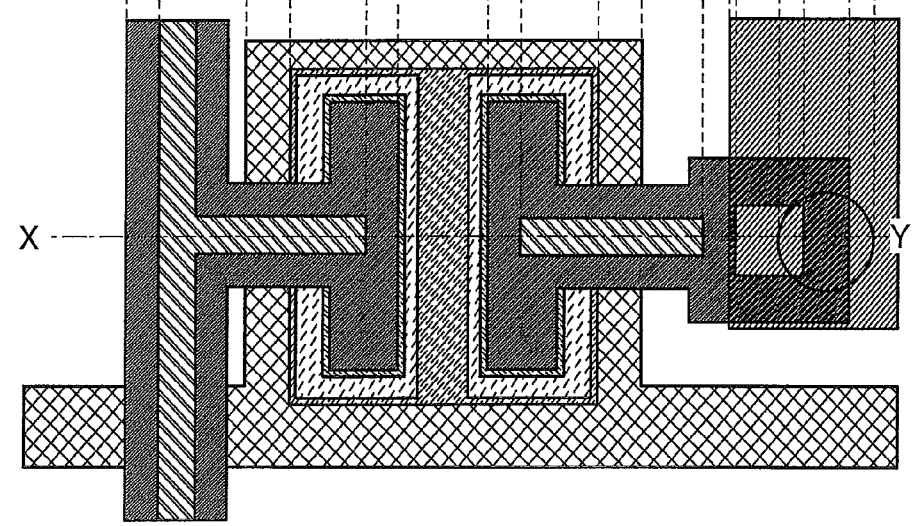

Next, a second insulating layer 128 is formed. Then, an opening 129 is formed in the second conductive layer 118 and the second insulating layer 128. After that, a fourth conductive layer 130 is formed to be connected to the second conductive layer 118 through the opening 129 (FIGS. 7A and 7B).

The second insulating layer 128 may be formed using an insulating material like the first insulating layer 104. Note that the second insulating layer 128 may be a single layer or a stacked layer of a plurality of layers. Here, silicon nitride may be used for the second insulating layer 128, for example.

The fourth conductive layer 130 can be formed using a conductive composition including a conductive macromolecule (also referred to as a conductive polymer) having a light-transmitting property. It is preferable that the fourth conductive layer 130 formed using the conductive composition have a sheet resistance of less than or equal to 10000 Ω/square and a light transmittance of greater than or equal to 70% at a wavelength of 550 nm. Further, the resistivity of the conductive macromolecule included in the conductive composition is preferably less than or equal to 0.1 Ω·cm.

As the conductive macromolecule, a so-called π-electron conjugated conductive macromolecule can be used. For example, polyaniline or a derivative thereof, polypyrrole or a derivative thereof, polythiophene or a derivative thereof, and a copolymer of two or more of aniline, pyrrole, and thiophene or a derivative thereof are given.

The fourth conductive layer 130 can be formed using, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

The fourth conductive layer 130 may be formed by processing a film formed using the above-mentioned material by a photolithography method.

When the fourth conductive layer 130 is formed using a light-transmitting material, the fourth conductive layer 130 can function as a pixel electrode.

Although not shown, a fourth insulating layer may be formed between the second insulating layer 128 and the fourth conductive layer 130.

In the semiconductor device manufactured in the above manner, the fourth conductive layer 130 forms a pixel electrode, so that the semiconductor device can be used as a pixel transistor that forms a pixel of a display device.

FIGS. 7A and 7B are a cross-sectional view and a top view illustrating a semiconductor device that is one embodiment of the present invention. FIG. 7A is a cross-sectional view taken along line X-Y in the top view of FIG. 7B. The semiconductor device illustrated in FIGS. 7A and 7B includes the first conductive layer 102 formed over the substrate 100, the first insulating layer 104 covering the first conductive layer 102, the first semiconductor layer 122 formed over the first insulating layer 104, the second semiconductor layer 124 which is divided by exposing part of the first semiconductor layer 122 over the first semiconductor layer 122, the impurity semiconductor layer 126 formed over the second semiconductor layer 124, the second conductive layer 118 formed over and in contact with at least part of the impurity semiconductor layer 126, the third conductive layer 121 formed over the second conductive layer 118 so that part of the second conductive layer 118 is exposed, the second insulating layer 128 formed to cover the first semiconductor layer 122, the second semiconductor layer 124, the impurity semiconductor layer 126, the second conductive layer 118, and the third conductive layer 121, and the fourth conductive layer 130 formed over at least the second insulating layer 128. The second conductive layer 118 and the fourth conductive layer 130 are connected with each other through the opening 129.

Alternatively, although not shown, the semiconductor device illustrated in FIGS. 7A and 7B may be provided with a gate (referred to as a back gate) that is formed using the first conductive layer 102. A back gate may be formed using the fourth conductive layer 130. The back gate may have a structure in which the back gate is connected to the gate formed using the first conductive layer 102 so as to have the same potential as the gate formed using the first conductive layer 102 or a structure in which a potential different from a potential of the first conductive layer 102 is supplied to the back gate formed using the fourth conductive layer 130 from a wiring for supplying a potential. The wiring for supplying a potential to the back gate formed using the fourth conductive layer 130 may be formed using the fourth conductive layer 130 or may be formed using a different layer.

Note that the first insulating layer 104 and the second insulating layer 128 are preferably silicon nitride layers. However, the first insulating layer 104 and the second insulating layer 128 are not limited to silicon nitride layers. Further, the first insulating layer 104 and the second insulating layer 128 may have a stacked structure of a plurality of layers. For example, the second insulating layer 128 may have a two-layer structure in which a silicon oxynitride layer is stacked over a silicon nitride layer or a three-layer structure in which a silicon oxynitride layer is formed over a silicon oxide layer, and a silicon nitride layer is formed over the silicon oxynitride layer. With use of a silicon oxide layer, a silicon oxynitride layer, or the like for the second insulating layer 128 in this manner, the thickness of the second insulating layer 128 can be smaller than that in the case of using a silicon nitride layer. This is because a silicon oxide layer and a silicon oxynitride layer each have lower dielectric constant than a silicon nitride layer.

Figure 8A:
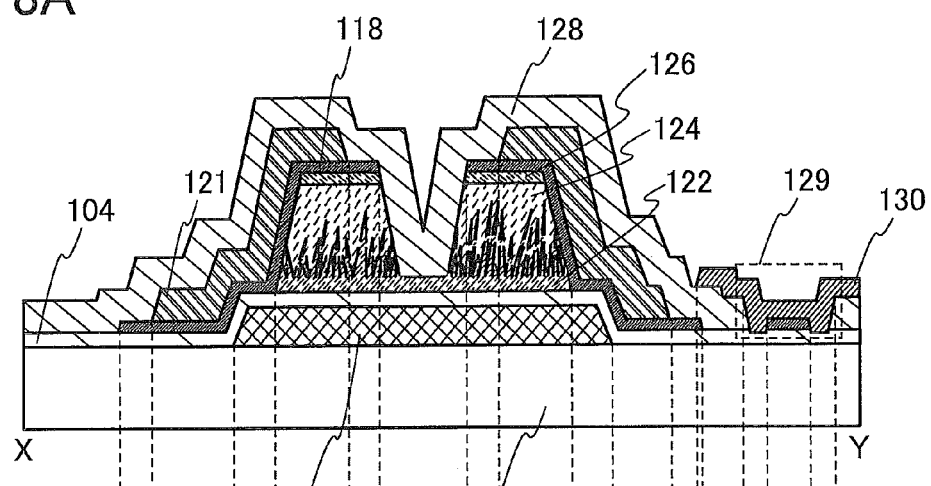
FIGS. 8A and 8B are a cross-sectional view and a top view illustrating a modification example of FIGS. 7A and 7B.
Figure 8B:
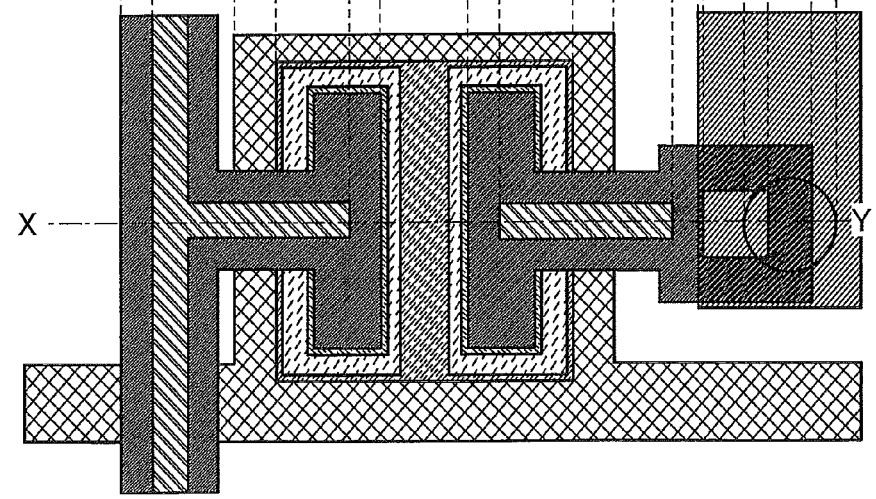

Although not shown in FIGS. 7A and 7B, the first insulating layer 104 may be etched when the opening 129 is formed, as in FIGS. 8A and 8B.

Figure 9A:
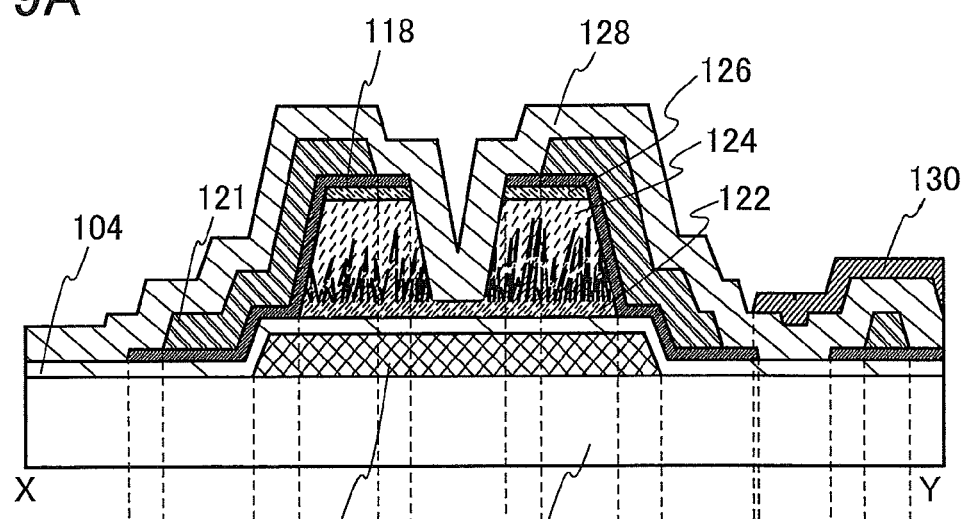
FIGS. 9A and 9B are a cross-sectional view and a top view illustrating a modification example of FIGS. 7A and 7B.
Figure 9B:
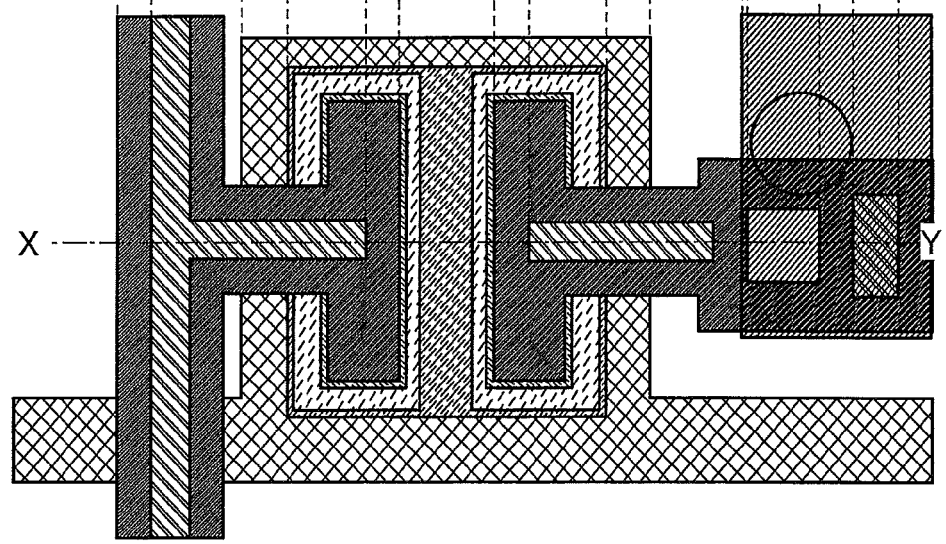

Although not shown in FIGS. 7A and 7B, in addition to the third conductive layer 121 which partially overlaps with the first conductive layer 102, the third conductive layer 121 may be formed outside the opening which is formed in the second conductive layer 118 using the etching mask 117 as in FIGS. 9A and 9B. It is preferable to form the third conductive layer 121 on the opposite side of a region in which the first conductive layer 102 is provided so that the opening formed in the second conductive layer 118 is provided between the third conductive layers 121 because balance between both sides of the opening in the second conductive layer 118 can be ensured. The opening through which the second conductive layer 118 and the fourth conductive layer 130 are connected with each other is preferably formed so that the third conductive layer 121 is not in contact with the fourth conductive layer 130.

Embodiment 2

In this embodiment, a semiconductor device that is one embodiment of the present invention and a manufacturing method thereof are described. Specifically, a semiconductor device in which a plurality of openings is formed and a manufacturing method thereof are described. Note that in the following description, FIG. 1A, FIG. 10A, FIG. 11A, FIG. 12A, FIG. 13A, FIG. 14A, and FIG. 15A are cross-sectional views taken along line X-Y in FIG. 1B, FIG. 10B, FIG. 11B, FIG. 12B, FIG. 13B, FIG. 14B, and FIG. 15B, respectively.

First, as in Embodiment 1, a first conductive layer 202 is formed over a substrate 200, and a first insulating layer 204 is formed so as to cover the first conductive layer 202. Next, a first semiconductor film 206, a second semiconductor film 208, and an impurity semiconductor film 210 are stacked in this order over the first insulating layer 204, and an etching mask 211 is formed over the impurity semiconductor film 210 (FIGS. 1A and 1B). Note that in FIG. 1A, reference numerals used in this embodiment are shown in parentheses.

The substrate 200 corresponds to the substrate 100 in Embodiment 1.

The first conductive layer 202 corresponds to the first conductive layer 102 in Embodiment 1.

The first insulating layer 204 corresponds to the first insulating layer 104 in Embodiment 1.

The first semiconductor film 206 corresponds to the first semiconductor film 106 in Embodiment 1.

The second semiconductor film 208 corresponds to the second semiconductor film 108 in Embodiment 1.

The impurity semiconductor film 210 corresponds to the impurity semiconductor film 110 in Embodiment 1.

The etching mask 211 corresponds to the etching mask 111 in Embodiment 1.

Figure 10A:
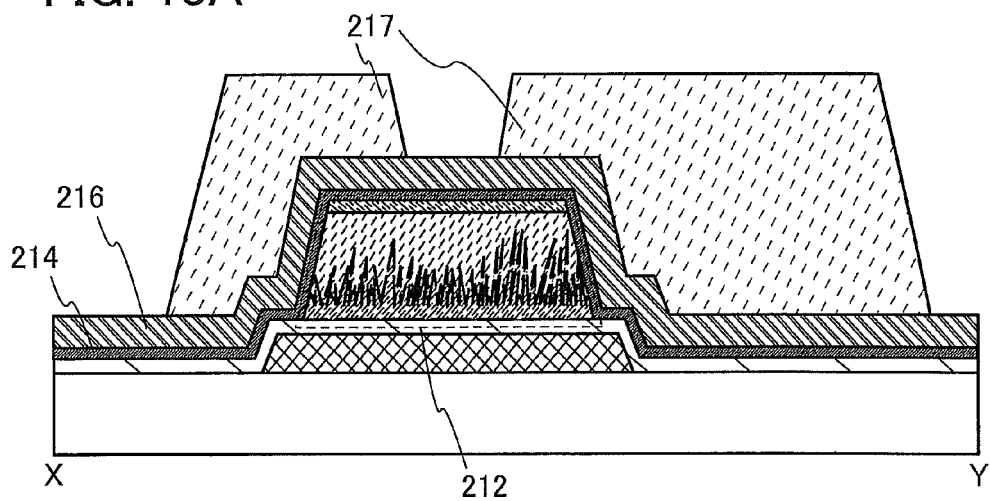
FIGS. 10A and 10B are a cross-sectional view and a top view illustrating a manufacturing method of a semiconductor device that is one embodiment of the present invention.
Figure 10B:
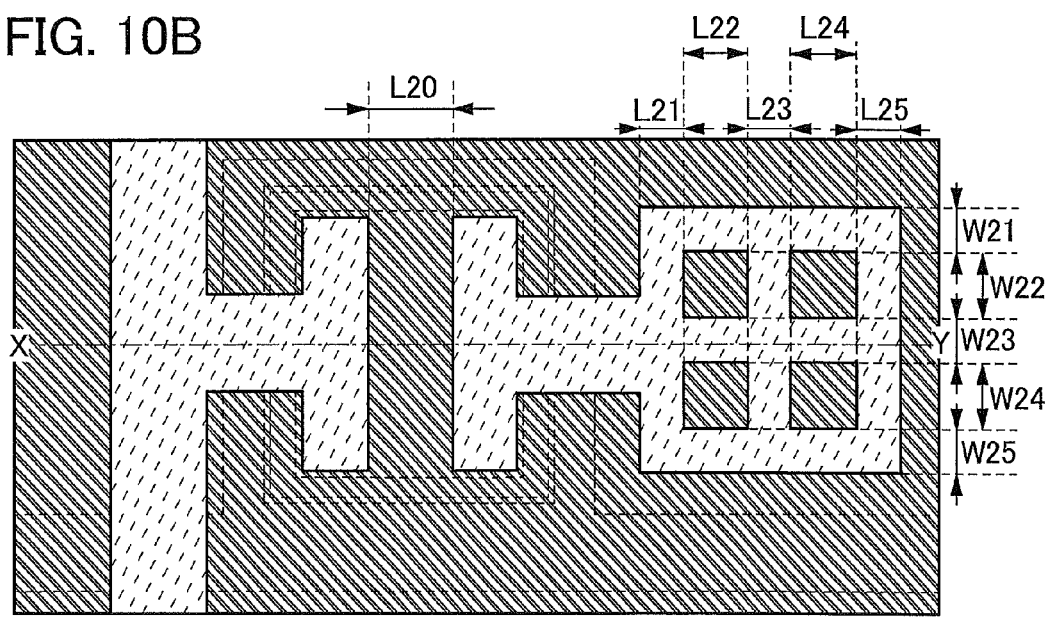

Next, with use of the etching mask 211, the first semiconductor film 206, the second semiconductor film 208, and the impurity semiconductor film 210 are subjected to etching to form a thin-film stack 212. Then, a second conductive film 214 and a third conductive film 216 are formed on the first insulating layer 204 and the thin-film stack 212, and an etching mask 217 is formed on the third conductive film 216 (FIGS. 10A and 10B).

The thin-film stack 212 corresponds to the thin-film stack 112 in Embodiment 1.

The second conductive film 214 corresponds to the second conductive film 114 in Embodiment 1.

The third conductive film 216 corresponds to the third conductive film 116 in Embodiment 1.

The etching mask 217 corresponds to the etching mask 117 in Embodiment 1.

Note that the etching mask 217 is preferably formed so that the width of an opening illustrated in FIGS. 10A and 10B is a minimum width. In other words, L22, L24, W22, and W24 are preferably formed to have a minimum value. This is because, when a width of an opening is large, an area of a light-transmitting region becomes small, which is one of causes of decrease in aperture ratio in the case of application to a light-transmitting display device. Note that although L22=L24=W22=W24 in FIG. 10B, there in no particular limitation. However, the etching mask is preferably formed so that all L22, L24, W22, and W24 in FIG. 10B have the minimum value; therefore, L22=L24=W22=W24 is preferable.

Note that when a layout of a thin film transistor is designed, the channel length L20 is preferably made small. In general, the channel length L20 is the minimum size which can be formed using the etching mask 217. Therefore, L20 is preferably set to the minimum exposure size of a light-exposure machine.

Here, since L22, L24, W22, and W24 are preferably small, it is preferable that L22=L24=W22=W24=L20. Further, the sizes thereof are preferably set to the minimum exposure size of a light-exposure machine.

Other parameters such as L21 shown in FIG. 10B are determined depending on the side-etching width in the side-etching performed later. The details will be described later.

Figure 11A:
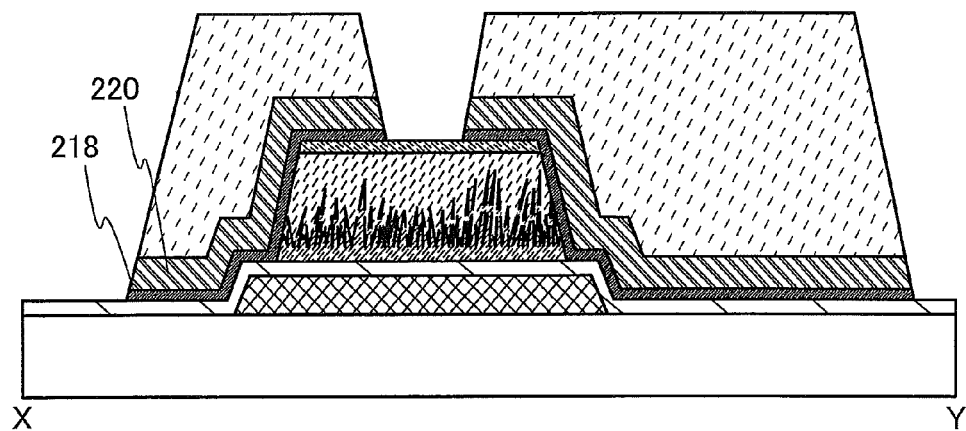
FIGS. 11A and 11B are a cross-sectional view and a top view illustrating the manufacturing method of a semiconductor device that is one embodiment of the present invention.
Figure 11B:
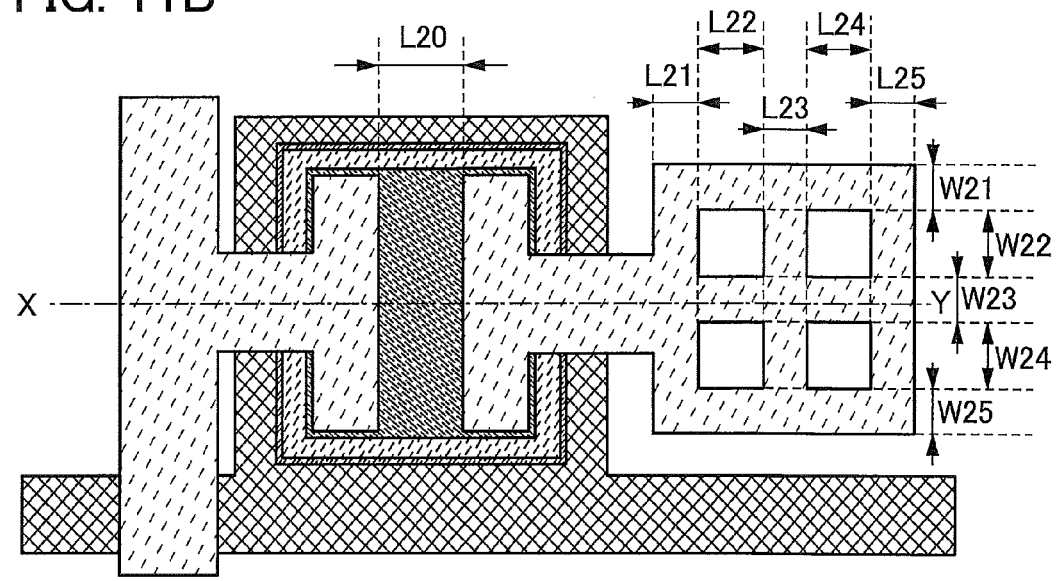

Then, the second conductive film 214 and the third conductive film 216 are etched using the etching mask 217, so that a second conductive layer 218 and an etched third conductive film 220 are formed (FIGS. 11A and 11B).

The second conductive layer 218 corresponds to the second conductive layer 118 in Embodiment 1.

An etched third conductive film 220 corresponds to the etched third conductive film 120 in Embodiment 1.

Figure 12A:
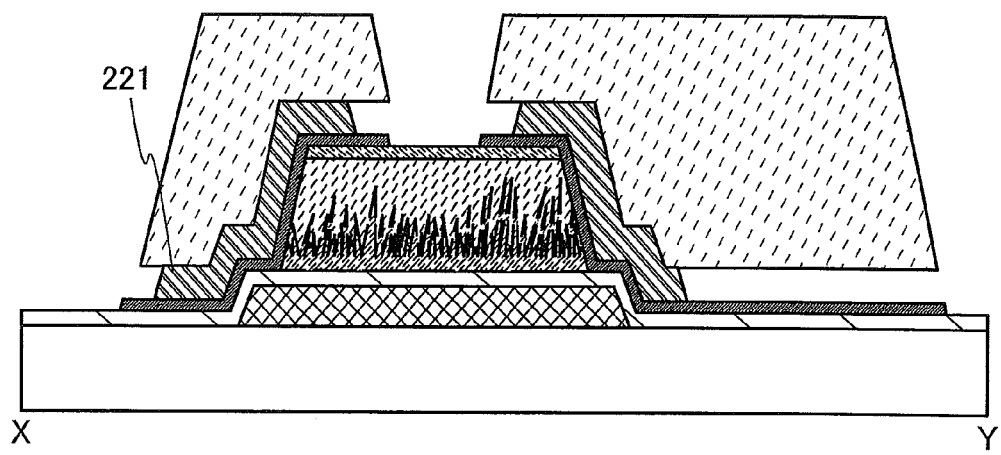
FIGS. 12A and 12B are a cross-sectional view and a top view illustrating the manufacturing method of a semiconductor device that is one embodiment of the present invention.
Figure 12B:
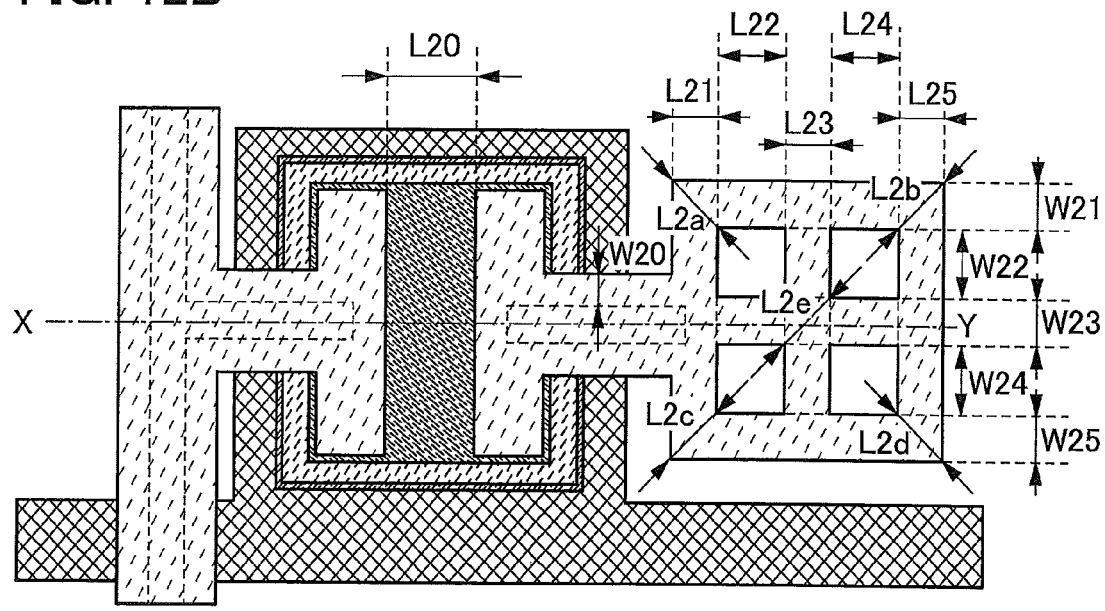

Next, the etched third conductive film 220 is etched, so that a third conductive layer 221 is formed (FIGS. 12A and 12B).

The third conductive layer 221 corresponds to the third conductive layer 121 in Embodiment 1.

The top surface shape of the etching mask 217 is determined depending on the side-etching width of the etched third conductive film 220.

In FIG. 12B, a distance W20 between an edge of the etching mask 217 and an edge of the third conductive layer 221 is substantially equal to the side-etching width of the etched third conductive film 220.

Note that in FIG. 12B, a minimum width W2S={L21, L23, L25, W21, W23, W25} of a portion adjacent to the opening provided in the etching mask 217 is smaller than twice of the side-etching width of the etched third conductive film 220. However, when W2S is too small, it is difficult to obtain an enough contact area with the fourth conductive layer; accordingly, W2S is preferably larger than at least W20. Therefore, it is preferable that W20<W2S<2W20 be satisfied.

Note that in FIG. 12B, it is most important that a maximum width W2L={L2a, L2b, L2c, L2d, L2e} of a portion adjacent to the opening provided in the etching mask 217 be smaller than twice of the side-etching width of the etched third conductive film 220 (0<W2L<2W20).

Here, as for L2a, L2b, L2c, 2d, and L2e, the following formulae 1 to 5 are satisfied.

$$L_a = \sqrt{(L_1)^2 + (W_1)^2}$$ [FORMULA 1]

$$L_b = \sqrt{(L_5)^2 + (W_1)^2}$$ [FORMULA 2]

$$L_c = \sqrt{(L_1)^2 + (W_5)^2}$$ [FORMULA 3]

$$L_d = \sqrt{(L_5)^2 + (W_5)^2}$$ [FORMULA 4]

$$L_e = \sqrt{(L_3)^2 + (W_3)^2}$$ [FORMULA 5]

The maximum length among L2a, L2b, L2c, L2d, and L2e is smaller than twice of the side-etching width (W20).

Here, in the case where the formula W2S=L21=L23=L25=W21=W23=W25 is satisfied, the formula W2L=L2a=L2b=L2c=L2d=L2e=√2·W2S is satisfied. Thus, the relation between the minimum width W2S and W20 that is equal to the side-etching width satisfies the formula W2S<√2·W20.

Figure 13A:
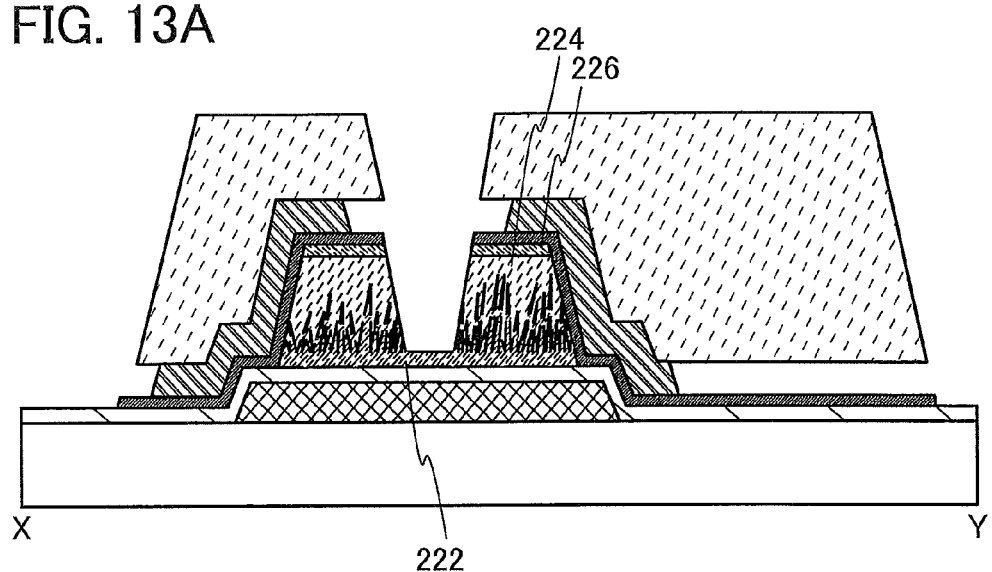
FIGS. 13A and 13B are a cross-sectional view and a top view illustrating the manufacturing method of a semiconductor device that is one embodiment of the present invention.
Figure 13B:
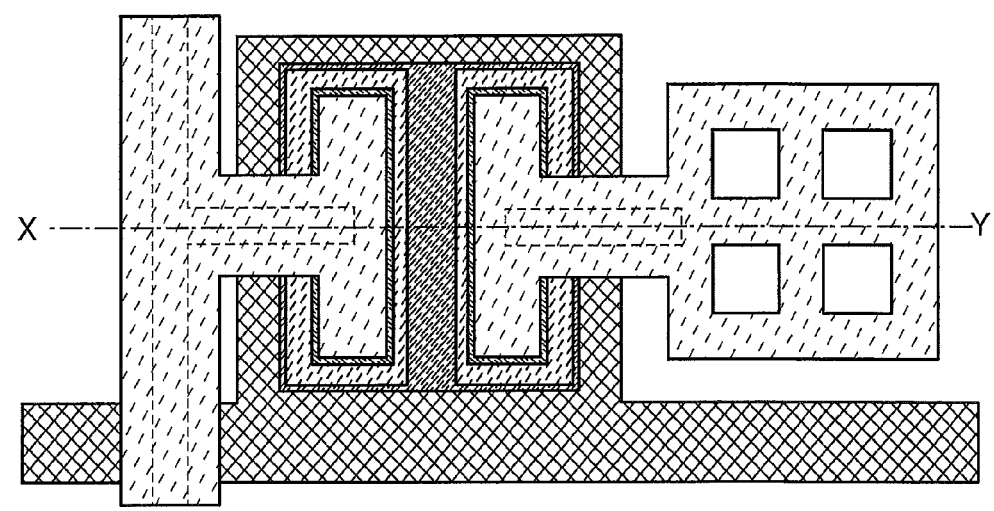

Next, the upper portion of the thin-film stack 212 is etched, so that a first semiconductor layer 222, a second semiconductor layer 224, and an impurity semiconductor layer 226 are formed (FIGS. 13A and 13B). At this time, the thin-film stack 212 may be etched by one step or a plurality of steps. It is preferable that the etching be performed so that a portion of the first semiconductor layer 222 that does not overlap with the second semiconductor layer 224 (i.e., a portion to be a channel formation region) is finally formed.

The first semiconductor layer 222 corresponds to the first semiconductor layer 122 in Embodiment 1.

The second semiconductor layer 224 corresponds to the second semiconductor layer 124 in Embodiment 1.

The impurity semiconductor layer 226 corresponds to the impurity semiconductor layer 126 in Embodiment 1.

Here, the etching of the thin-film stack 212 is performed so that the portion of the first semiconductor layer 222 that does not overlaps with the second semiconductor layer 224 (i.e., a portion to be a channel formation region) is formed.

Figure 14A:
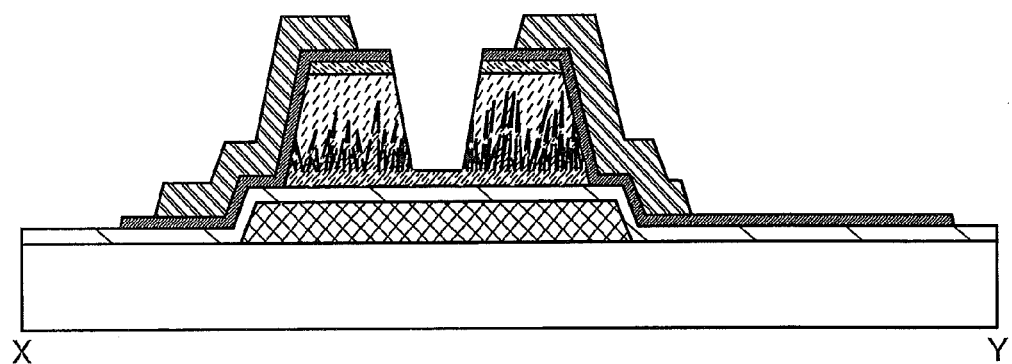
FIGS. 14A and 14B are a cross-sectional view and a top view illustrating the manufacturing method of a semiconductor device that is one embodiment of the present invention.
Figure 14B:
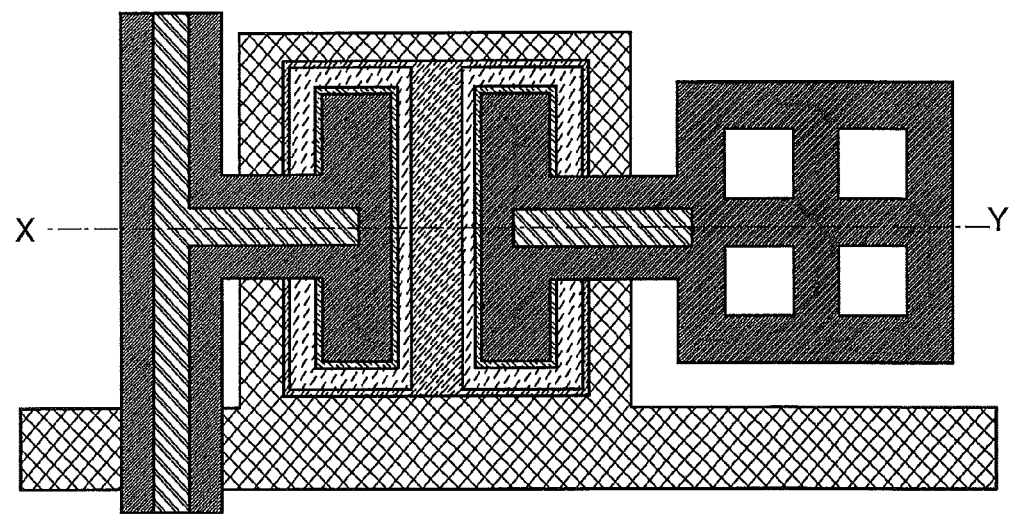

After that, the etching mask 217 is removed (FIGS. 14A and 14B).

Figure 15A:
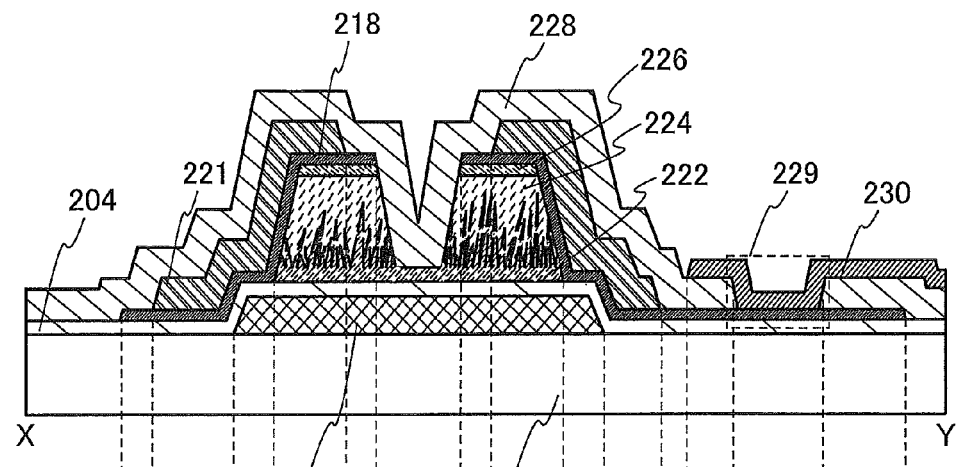
FIGS. 15A and 15C are cross-sectional views and FIG. 15B is a top view illustrating the manufacturing method of a semiconductor device that is one embodiment of the present invention.
Figure 15B:
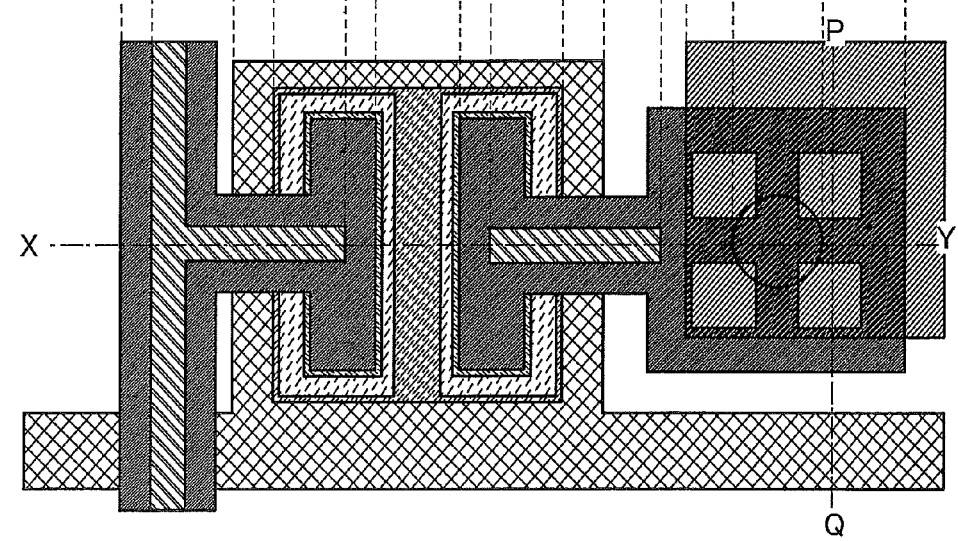

Next, a second insulating layer 228 is formed. Then, an opening 229 is formed in the second conductive layer 218 and the second insulating layer 228. After that, a fourth conductive layer 230 is formed to be connected to the second conductive layer 218 through the opening 229 (FIGS. 15A and 15B).

The second insulating layer 228 corresponds to the second insulating layer 128 in Embodiment 1.

The fourth conductive layer 230 corresponds to the fourth conductive layer 130 in Embodiment 1.

Although not shown, a fourth insulating layer may be formed between the second insulating layer 228 and the fourth conductive layer 230.

In the semiconductor device manufactured in the above manner, the fourth conductive layer 230 forms a pixel electrode, so that the semiconductor device can be used as a pixel transistor that forms a pixel of a display device.

Figure 15C:
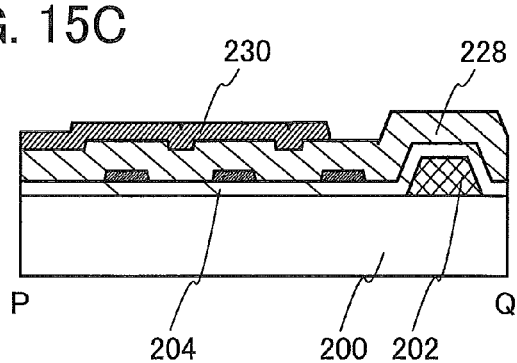

FIGS. 15A and 15B are a cross-sectional view and a top view illustrating a semiconductor device that is one embodiment of the present invention. FIG. 15A is a cross-sectional view taken along line X-Y in the top view of FIG. 15B. In addition, FIG. 15C is a cross-sectional view taken along line P-Q in a top view of FIG. 15B. The semiconductor device illustrated in FIGS. 15A to 15C includes the first conductive layer 202 formed over the substrate 200, the first insulating layer 204 covering the first conductive layer 202, the first semiconductor layer 222 formed over the first insulating layer 204, the second semiconductor layer 224 which is divided by exposing part of the first semiconductor layer 222 over the first semiconductor layer 222, the impurity semiconductor layer 226 formed over the second semiconductor layer 224, the second conductive layer 218 formed over and in contact with at least part of the impurity semiconductor layer 226, the third conductive layer 221 formed over the second conductive layer 218 so that part of the second conductive layer 218 is exposed, the second insulating layer 228 formed to cover the first semiconductor layer 222, the second semiconductor layer 224, the impurity semiconductor layer 226, the second conductive layer 218, and the third conductive layer 221, and the fourth conductive layer 230 formed over at least the second insulating layer 228. The second conductive layer 218 and the fourth conductive layer 230 are connected with each other through the opening 229.

Alternatively, although not shown, the semiconductor device illustrated in FIGS. 15A and 15B may be provided with a gate (referred to as a back gate) that is formed using the first conductive layer 202. A back gate may be formed using the fourth conductive layer 230. The back gate may have a structure in which the back gate is connected to the gate formed using the first conductive layer 202 so as to have the same potential as the gate formed using the first conductive layer 202 or a structure in which a potential different from a potential of the first conductive layer 202 is supplied to the back gate formed using the fourth conductive layer 230 from a wiring for supplying a potential. The wiring for supplying a potential to the back gate formed using the fourth conductive layer 230 may be formed using the fourth conductive layer 230 or may be formed using a different layer.

Figure 16A:
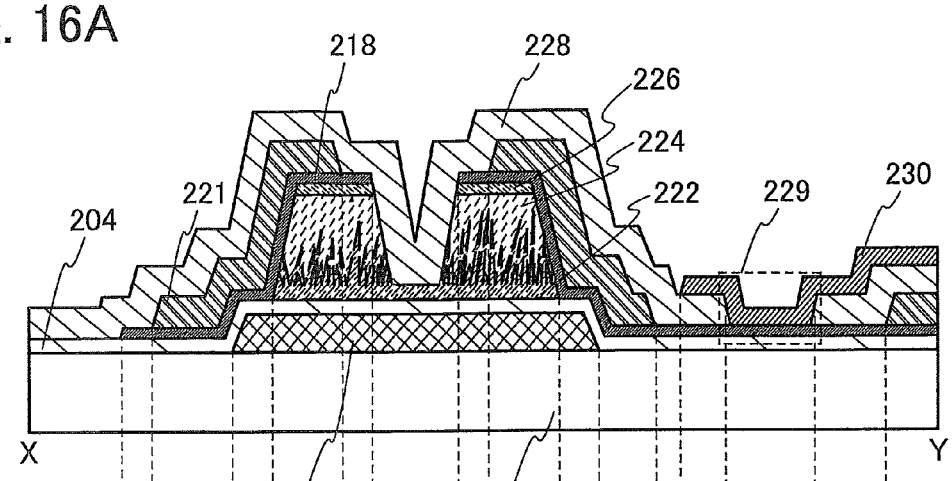
FIGS. 16A and 16B are a cross-sectional view and a top view illustrating a modification example of FIGS. 15A and 15B.
Figure 16B:
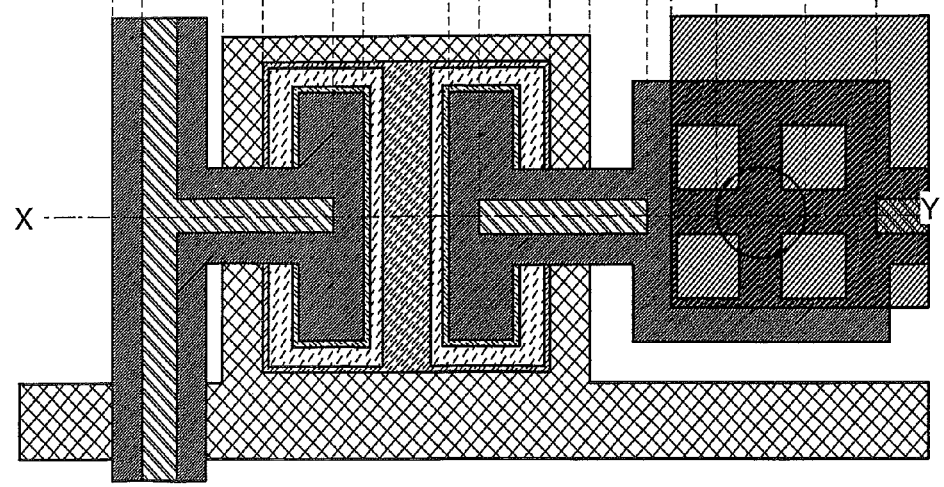

Although not shown in FIGS. 15A to 15C, in addition to the third conductive layer 221 which partially overlaps with the first conductive layer 202, the third conductive layer 221 may be formed outside the plurality of opening which is formed in the second conductive layer 218 using the etching mask 217 as in FIGS. 16A and 16B. It is preferable to form the third conductive layer 221 on the opposite side of a region in which the first conductive layer 202 is provided so that the plurality of openings in the second conductive layer 218 is provided between the third conductive layers 221 because balance between both sides of the plurality of openings in the second conductive layer 118 can be ensured. The opening through which the second conductive layer 218 and the fourth conductive layer 230 are connected with each other is preferably formed so that the third conductive layer 221 is not in contact with the fourth conductive layer 230.

Figure 17A:
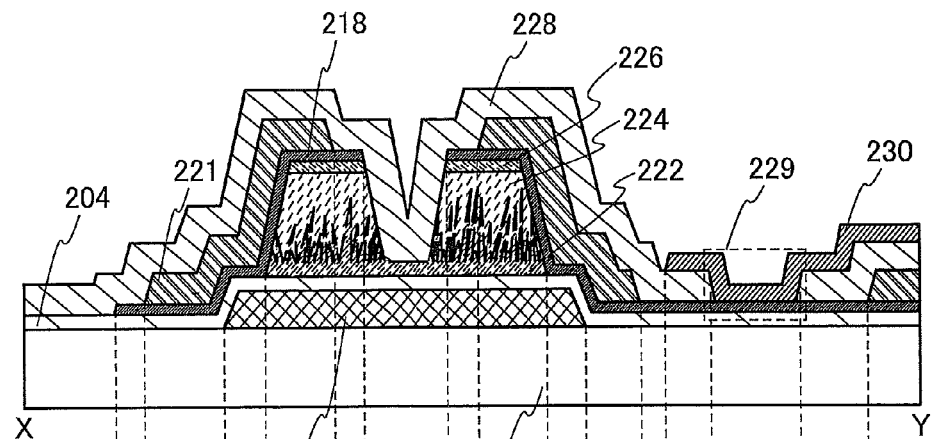
FIGS. 17A and 17B are a cross-sectional view and a top view illustrating a modification example of FIGS. 15A and 15B.
Figure 17B:
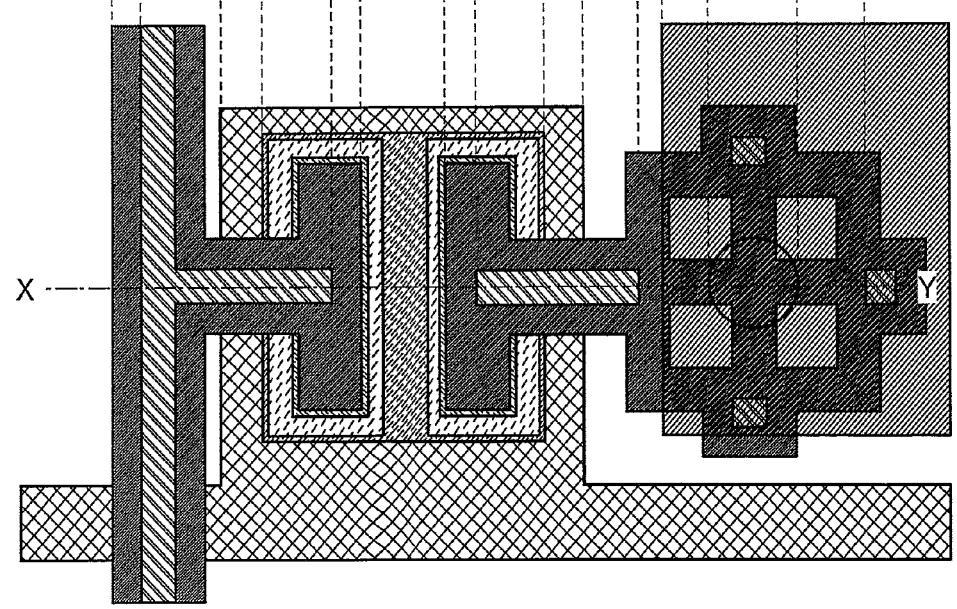

Further, it is further preferable to form the third conductive layer 221 in the direction perpendicular to the line X-Y, in addition to the direction parallel to the line X-Y, as illustrated in FIGS. 17A and 17B. This is because a mechanical balance can be maintained between the X-Y direction and the direction perpendicular to the line X-Y. The mechanical balance can suppress deflection generated in the etching mask 217 in the manufacturing process, so that the etching mask 217 can be prevented from being damaged in the manufacturing process. Therefore, decrease in yield can be suppressed.

The opening through which the second conductive layer 218 and the fourth conductive layer 230 are connected with each other is preferably formed to ensure a certain space so that the third conductive layer 221 is not in contact with the fourth conductive layer 230. Specifically, it is preferable that a distance at least equal to a radius of opening 229 be ensured between an edge of the opening 229 and the third conductive layer 221.

As described above, a plurality of openings is devised to be provided in an etching mask, so that the contact area in a contact hole can be made sufficiently large. Further, reduction in yield can be suppressed.

Embodiment 3

Figure 18:
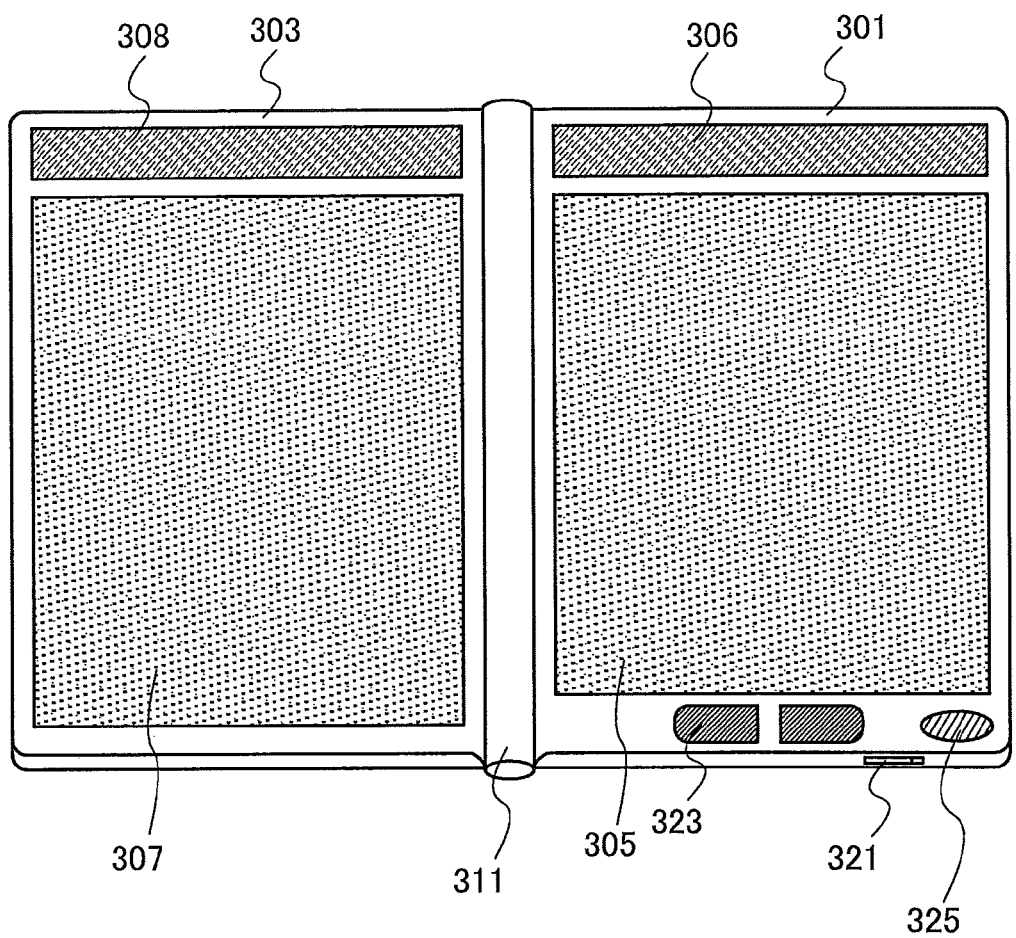
FIG. 18 is a diagram illustrating a semiconductor device that is one embodiment of the present invention.

As a semiconductor device to which the thin film transistor described in Embodiment 1 or Embodiment 2 is applied, an electronic paper is given. An electronic paper can be used for electronic appliances of a variety of fields as long as they can display data. For example, electronic paper can be applied to an electronic book reader (e-book), a poster, a digital signage, a public information display (PID), an advertisement in a vehicle such as a train, displays of various cards such as a credit card, and the like. FIG. 18 illustrates an example of the electronic appliances.

FIG. 18 illustrates an example of an electronic book reader. For example, an electronic book reader 300 includes two housings 301 and 303. The housing 301 and the housing 303 are combined with a hinge 311 so that the electronic book reader 300 can be opened and closed with the hinge 311 as an axis. With such a structure, the electronic book reader 300 can be handled like a paper book.

A display portion 305 and a photoelectric conversion device 306 are incorporated in the housing 301. A display portion 307 and a photoelectric conversion device 308 are incorporated in the housing 303. The display portions 305 and 307 may display one image or different images. In the case where the display portions 305 and 307 display different images, for example, a display portion on the right (the display portion 305 in FIG. 18) can display text and a display portion on the left (the display portion 307 in FIG. 18) can display graphics.

FIG. 18 illustrates an example in which the housing 301 is provided with an operation portion and the like. For example, the housing 301 is provided with a power switch 321, operation keys 323, a speaker 325, and the like. With the operation keys 323, pages can be turned. Note that a keyboard, a pointing device, or the like may also be provided on the surface of the housing, on which the display portion is provided. Further, an external connection terminal (an earphone terminal, a USB terminal, a terminal that can be connected to an AC adapter or a variety of cables such as a USB cable, or the like), a recording medium insertion portion, and the like may be provided on the back surface or the side surface of the housing. Furthermore, the electronic book reader 300 may have a function of an electronic dictionary.

The electronic book reader 300 may be configured to transmit and receive data wirelessly. Through wireless communication, desired book data or the like can be purchased and downloaded from an electronic book server.

Embodiment 4

As a semiconductor device in which a thin film transistor manufactured according to any of Embodiment 1 or Embodiment 2 is used, a variety of electronic appliances (including an amusement machine) can be given in addition to electronic paper. Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 19A:
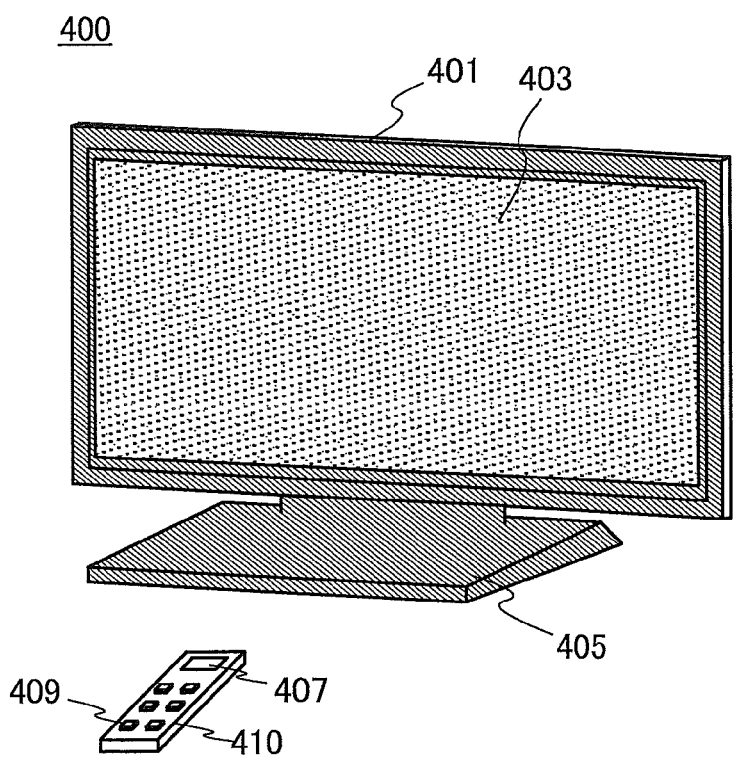
FIGS. 19A and 19B are diagrams each illustrating a semiconductor device that is one embodiment of the present invention.

FIG. 19A illustrates an example of a television set. A display portion 403 is incorporated in a housing 401 of a television set 400. Images can be displayed on the display portion 403. Here, the housing 401 is supported by a stand 405.

The television set 400 can be operated by an operation switch of the housing 401 or a separate remote controller 410. Channels can be switched and volume can be controlled with operation keys 409 of the remote controller 410, whereby an image displayed on the display portion 403 can be controlled. Moreover, the remote controller 410 may have a display portion 407 in which the information outgoing from the remote controller 410 is displayed.

Note that the television set 400 is provided with a receiver, a modem, and the like. With the use of the receiver, general television broadcasting can be received. Furthermore, when the display device is connected to a communication network with or without wires via the modem, one-way (from a sender to a receiver) or two-way (between a sender and a receiver or between receivers) information communication can be performed.

Figure 19B:
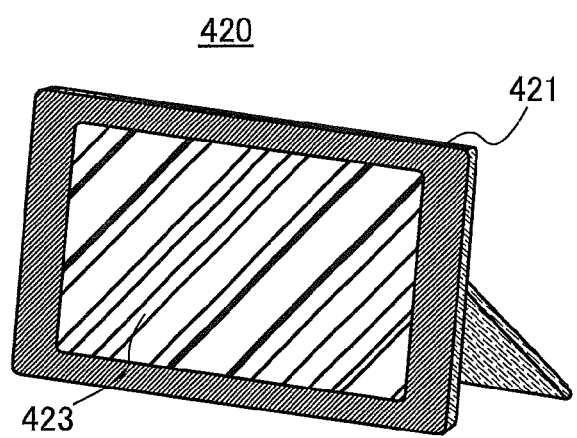

FIG. 19B illustrates an example of a digital photo frame. For example, a display portion 423 is incorporated in a housing 421 of the digital photo frame 420. The display portion 423 can display various images. For example, the display portion 423 can display data of an image shot by a digital camera or the like to function as a normal photo frame.

Note that the digital photo frame 420 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame. For example, a memory storing an image data taken with a digital camera is inserted in the recording medium insertion portion of the digital photo frame and the image data is loaded, whereby the image data can be displayed on the display portion 423.

The digital photo frame 420 may have a configuration capable of wirelessly transmitting and receiving data. The structure may be employed in which desired image data is transferred wirelessly to be displayed.

Figure 20:
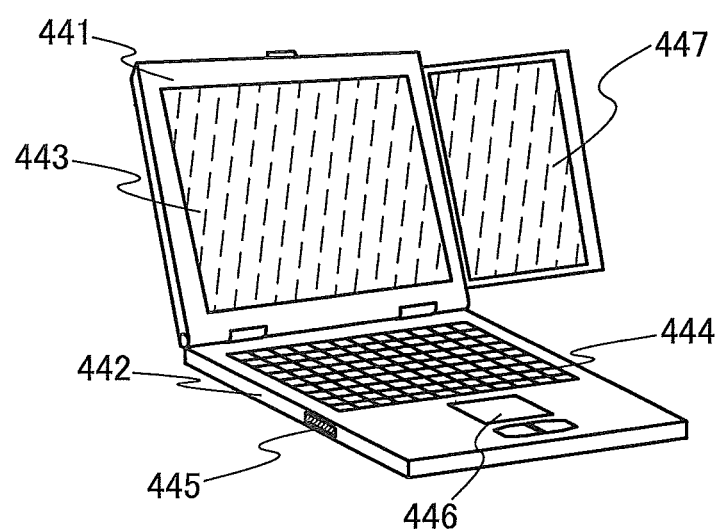
FIG. 20 is a diagram illustrating a semiconductor device that is one embodiment of the present invention.
Figure 21A:
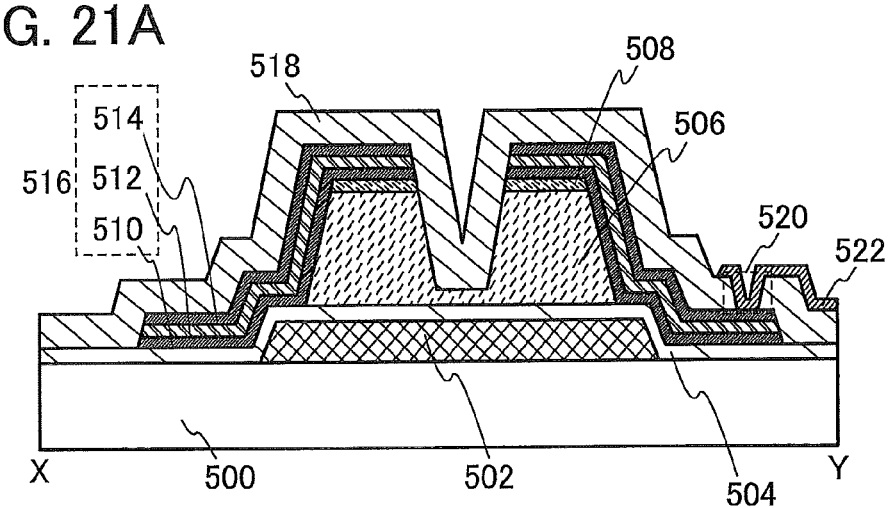
FIGS. 21A to 21C are cross-sectional views illustrating a manufacturing method of a conventional semiconductor device.
Figure 21B:
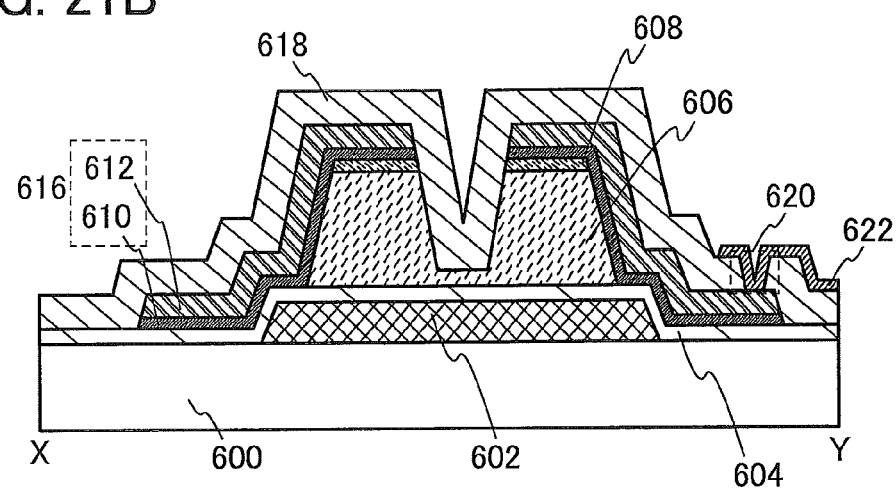
Figure 21C:
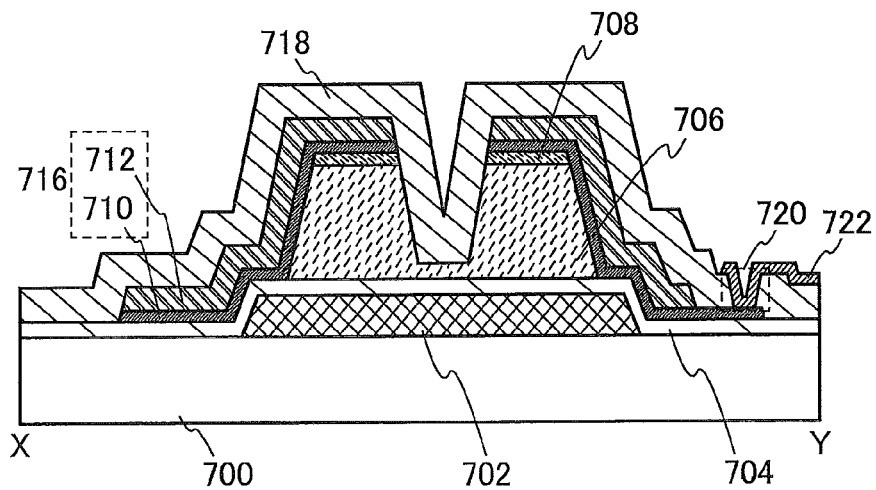

FIG. 20 is a perspective view illustrating an example of a portable computer.

In the portable computer of FIG. 20, a top housing 441 having a display portion 443 and a bottom housing 442 having a keyboard 444 can overlap with each other by closing a hinge unit which connects the top housing 441 and the bottom housing 442. The portable computer is convenient for carrying around. Moreover, in the case of using the keyboard for input, the hinge unit is opened so that a user can input looking at the display portion 443.

The bottom housing 442 includes a pointing device 446 with which input can be performed, in addition to the keyboard 444. Further, when the display portion 443 is a touch input panel, input can be performed by touching part of the display portion. The bottom housing 442 includes an arithmetic function portion such as a CPU or hard disk. In addition, the bottom housing 442 includes another device, for example, an external connection port 445 into which a communication cable conformable to communication standards of a USB is inserted.

The top housing 441, which includes a display portion 447 and can keep the display portion 447 therein by sliding it toward the inside of the top housing 441, can have a large display screen. In addition, the user can adjust the orientation of a screen of the storable display portion 447. When the storable display portion 447 is a touch input panel, input can be performed by touching part of the storable display portion.

The display portion 443 or the storable display portion 447 is formed using an image display device such as a liquid crystal display panel or a light-emitting display panel including an organic light-emitting element, an inorganic light-emitting element, or the like.

In addition, the portable computer illustrated in FIG. 20 can be provided with a receiver and the like and can receive a TV broadcast to display an image on the display portion. While the hinge unit which connects the top housing 441 and the bottom housing 442 is kept closed, the whole screen of the display portion 447 is exposed by sliding the display portion 447 out and the angle of the screen is adjusted; thus, the user can watch a television broadcast. In this case, the hinge unit is not opened and display is not performed on the display portion 443. In addition, start up of only a circuit for displaying television broadcast is performed. Therefore, power can be consumed to the minimum, which is useful for the portable computer whose battery capacity is limited.

This application is based on Japanese Patent Application serial no. 2010-198018 filed with Japan Patent Office on Sep. 3, 2010, and 2010-202552 filed with Japan Patent Office on Sep. 10, 2010, the entire contents of which are hereby incorporated by reference.

What is claimed is:

1. A semiconductor device comprising:
a first conductive layer;
a first insulating layer covering the first conductive layer;
a thin-film stack over the first insulating layer, the thin-film stack comprising a semiconductor layer and an impurity semiconductor layer over the semiconductor layer;
a second conductive layer in contact with at least the impurity semiconductor layer of the thin-film stack;
a third conductive layer over a part of the first conductive layer;
a second insulating layer comprising a contact hole over the second conductive layer; and
a fourth conductive layer connected to the second conductive layer through the contact hole, and
wherein the contact hole is formed in an intersection portion of grating-shaped electrodes formed using the second conductive layer, and
wherein the second conductive layer comprises a plurality of openings.

2. The semiconductor device according to claim 1, wherein a distance between a side surface of the third conductive layer and a side surface of the second conductive layer is substantially constant.

3. A semiconductor device comprising:
a first conductive layer;
a first insulating layer covering the first conductive layer;
a first semiconductor layer over the first conductive layer with the first insulating layer interposed therebetween;
a second semiconductor layer over the first semiconductor layer, the second semiconductor layer comprising an impurity element imparting one conductivity type;
a second conductive layer in contact with at least the second semiconductor layer,
  wherein the second conductive layer comprises a first region and a second region outside the first region,
  wherein the first region overlaps the first conductive layer, the first semiconductor layer, and the second semiconductor layer, and
  wherein the second region has a plurality of openings to provide a grating-shaped electrode;
a third conductive layer over a part of the second conductive layer;
a second insulating layer over the second conductive layer and the third conductive layer, wherein the second insulating layer comprises a contact hole over the second region; and
a fourth conductive layer in contact with the second conductive layer through the contact hole,
wherein the contact hole is formed in an intersection portion of the grating-shaped electrode formed using the second conductive layer.

4. The semiconductor device according to claim 3, wherein end portions of the third conductive layer are positioned more inwardly than end portions of the second conductive layer.

5. The semiconductor device according to claim 3, wherein the third conductive layer is provided over the first region.

6. The semiconductor device according to claim 3, wherein the second insulating layer is in contact with the second region.

* * * * *